(12) United States Patent
Sasaki et al.

(10) Patent No.: US 6,636,398 B2
(45) Date of Patent: Oct. 21, 2003

(54) MAGNETORESISTIVE EFFECT SENSOR, THIN-FILM MAGNETIC HEAD WITH THE SENSOR, MANUFACTURING METHOD OF MAGNETORESISTIVE SENSOR AND MANUFACTURING METHOD OF THIN-FILM MAGNETIC HEAD

(75) Inventors: Tetsuro Sasaki, Tokyo (JP); Koichi Terunuma, Tokyo (JP); Kosuke Tanaka, Tokyo (JP)

(73) Assignee: TDK Corporation, Tokyo (JP)

( * ) Notice: Subject to any disclaimer, the term of this patent is extended or adjusted under 35 U.S.C. 154(b) by 204 days.

(21) Appl. No.: 09/867,424

(22) Filed: May 31, 2001

(65) Prior Publication Data

US 2002/0044398 A1 Apr. 18, 2002

(30) Foreign Application Priority Data

Jun. 2, 2000 (JP) .......................................... 2000-165915

(51) Int. Cl.[7] ................................................. G11B 5/39
(52) U.S. Cl. ................................................. 360/324.12
(58) Field of Search ......................... 360/324.1, 324.11, 360/324.12, 324.2

(56) References Cited

U.S. PATENT DOCUMENTS

| | | | | |
|---|---|---|---|---|
| 5,796,561 A | * | 8/1998 | Mauri | 360/324.11 |
| 6,040,961 A | * | 3/2000 | Gill | 360/324.11 |
| 6,175,476 B1 | * | 1/2001 | Huai et al. | 360/324.11 |
| 6,195,240 B1 | * | 2/2001 | Gill | 360/324.12 |
| 6,301,089 B1 | * | 10/2001 | Saito et al. | 360/324.12 |
| 6,341,052 B2 | * | 1/2002 | Hayashi | 360/324.1 |
| 6,452,204 B1 | * | 9/2002 | Ishiwata et al. | 257/9 |

OTHER PUBLICATIONS

U.S. application No. 09/772,930, Koichi Terunuma et al., filed Jan. 31, 2001.

* cited by examiner

*Primary Examiner*—David L. Ometz
(74) *Attorney, Agent, or Firm*—Burns, Doane, Swecker & Mathis, L.L.P.

(57) ABSTRACT

A MR sensor includes at least one pinned layer, at least one nonmagnetic layer, and a free layer layered with the at least one pinned layer via the at least one nonmagnetic layer. A magnetization direction of the at least one pinned layer is fixed, and a magnetization direction of the free layer is variable depending upon a magnetic field applied to the free layer. A nonmagnetic metal is diffused in at least part of the free layer.

45 Claims, 20 Drawing Sheets

MAGNETORESISTIVE EFFECT SENSOR, THIN-FILM MAGNETIC HEAD WITH THE SENSOR, MANUFACTURING METHOD OF MAGNETORESISTIVE SENSOR AND MANUFACTURING METHOD OF THIN-FILM MAGNETIC HEAD

FIELD OF THE INVENTION

The present invention relates to a magnetoresistive effect (MR) sensor using giant magnetoresistive effect (GMR) or tunneling magnetoresistive effect (TMR), to a thin-film magnetic head with the MR sensor, used for a magnetic recording and reproducing unit such as a HDD (Hard Disk Drive) unit or a FDD (Floppy Disk Drive) unit, to a manufacturing method of a MR sensor, and to a manufacturing method of a thin-film magnetic head.

DESCRIPTION OF THE RELATED ART

Recently, a thin-film magnetic head with a MR sensor based on spin valve effect of GMR characteristics is proposed in order to satisfy the requirement for higher sensitivity and higher power in a magnetic head in accordance with ever increasing data storage densities in today's HDD units. A spin valve effect (SV) MR sensor has a sandwich structure of first and second thin-film layers of a ferromagnetic material magnetically separated by a thin-film layer of non-magnetic material, and an adjacent layer of anti-ferromagnetic material is formed in physical contact with the second ferromagnetic layer (pinned layer) to provide exchange bias magnetic field by exchange coupling at the interface of the layers. The magnetization direction in the pinned layer is constrained or maintained by the exchange coupling. On the other hand the magnetization direction of the first ferromagnetic layer (free layer) is free to rotate in response to an externally applied magnetic field. The direction of the magnetization in the free layer changes between parallel and anti-parallel against the direction of the magnetization in the pinned layer, and hence the magneto-resistance greatly changes and GMR characteristics are obtained.

The output characteristic of the SVMR sensor depends upon the angular difference of magnetization between the free and pinned ferromagnetic layers. The direction of the magnetization of the free layer is free to rotate in accordance with an external magnetic field from a magnetic medium. That of the pinned layer is fixed to a specific direction (pinned direction) by the exchange coupling between this layer and adjacently formed anti-ferromagnetic layer.

In this kind of SVMR sensor, an under layer is in general formed under the free layer. A material for this under layer will be selected so as to ensure (1) a high MR ratio by improving orientation in (1, 1, 1) plane of the free layer with a face-centered cubic structure, (2) a few diffusion into the free layer, and (3) an excellent corrosion resistance. More concretely, in case that the free layer has a multi-layered structure of a NiFe layer and a CoFe layer, the under layer is formed by Ta, Nb, Zr, Hf or else.

However, in case that the under layer is formed by such material, the improvement of the MR ratio is limited to 7–8% or less and a MR ratio of more than 10% cannot be expected even if the free layer material is appropriately selected.

In order to solve such problem, the assignee of this application has proposed, in a previous U.S. patent application Ser. No. 09/772,930 filed on Jan. 31, 2001 (now pending), a MR sensor which ensures a MR ratio more than 10% by forming an under layer having a face-centered cubic crystal structure and oriented in (1, 1, 1) plane.

Although a high MR ratio can be attained by using such under layer proposed in the previous patent application, a resistance change $\Delta Rs$ of the MR sensor which corresponds to a final MR output cannot be increased. This is because diffusion into the free layer from this under layer is a little causing a relative resistance of the free layer to decrease and therefore a relative resistance of the whole multi-layered structure of the MR sensor to also decrease. As a result, it becomes difficult to narrow the MR sensor so as to satisfy the increased data storage density.

Furthermore, it is requested for a MR sensor with no under layer as formed in the MR sensor proposed in the previous patent application to improve variation in an asymmetry characteristics.

SUMMARY OF THE INVENTION

It is therefore an object of the present invention to provide a MR sensor with a great change in MR resistance $\Delta Rs$ so as to conform to increased data storage density, a thin-film magnetic head with the MR sensor, a manufacturing method of the MR sensor, and a manufacturing method of the thin-film magnetic head.

Another object of the present invention is to provide a MR sensor that can improve variation in an asymmetry characteristics, a thin-film magnetic head with the MR sensor, a manufacturing method of the MR sensor, and a manufacturing method of the thin-film magnetic head.

The present invention concerns a MR sensor and a thin-film magnetic head with the MR sensor. The MR sensor includes at least one pinned layer, at least one nonmagnetic layer, and a free layer layered with the at least one pinned layer via the at least one nonmagnetic layer. A magnetization direction of the at least one pinned layer is fixed, and a magnetization direction of the free layer is variable depending upon a magnetic field applied to the free layer. A nonmagnetic metal is diffused in at least part of the free layer.

Since a nonmagnetic metal is diffused in a part of the free layer, a sheet resistance Rs of the free layer becomes large. In general, a resistance change $\Delta Rs$ of the MR sensor is given from $\Delta Rs\ (\Omega) = MR\ (\%) \times Rs\ (\Omega)$, where MR is a MR ratio and Rs is the sheet resistance. Therefore, if the sheet resistance Rs of the free layer increases, the change in MR resistance $\Delta Rs$ increases. Thus, a high MR resistance change $\Delta Rs$ above 2.5 $\Omega$ can be obtained. Also, variation in asymmetry characteristics can be greatly improved. As a result, a narrower MR sensor to conform to increased data storage density and a thin-film magnetic head with the MR sensor can be obtained.

It is preferred that the sensor further includes a mutual diffusion layer made of the nonmagnetic metal and a metallic composition of the free layer is diffused in the mutual diffusion layer.

It is preferred that the mutual diffusion layer is inserted in the middle of the free layer, or that the mutual diffusion layer is layered on one face of the free layer and the other face of the free layer being in contact with the at least one nonmagnetic layer.

It is also preferred that the mutual diffusion layer has a thickness of 0.1 to 0.5 nm.

It is preferred that the nonmagnetic metal contains at least one component selected from a group of Al, Si, Ti, V, Cr, Mn, Ga, Ge, Y, Zr, Nb, Mo, Ru, Rh, Pd, In, Sn, Hf, Ta, W, Re, Os, Ir and Pt.

It is further preferred that the sensor further includes at least one anti-ferromagnetic layer for fixing the magnetization direction of the at least one pinned layer using a bias magnetic field due to exchange coupling, the at least one anti-ferromagnetic layer being layered to contact with the at least one pinned layer. In this case, preferably, the at least one pinned layer has a single layer structure including a ferromagnetic layer, a multi-layered structure including ferromagnetic layers, or a multi-layered structure including ferromagnetic layers and a nonmagnetic layer.

It is preferred that the at least one pinned layer has a multi-layered structure including at least two ferromagnetic layers that are anti-ferromagnetically coupled with each other to have magnetic moments in opposite directions. Since the magnetization is automatically fixed, no anti-ferromagnetic layer for pinning by exchange coupling the pinned layer is needed.

It is also preferred that the at least one pinned layer is at least one ferromagnetic layer, a magnetization of the at least one ferromagnetic layer being fixed by a magnetic field produced due to a current flowing through the sensor. Since the magnetization is fixed by the bias magnetic field due to the sense current, no anti-ferromagnetic layer for pinning by exchange coupling the pinned layer is needed.

It is preferred that the at least one nonmagnetic layer consists of one nonmagnetic layer and the at least one pinned layer consists of one pinned layer, and that the sensor has a multi-layered structure of an under layer, the free layer, the one nonmagnetic layer and the one pinned layer sequentially layered in this order from a substrate side.

It is preferred that the at least one nonmagnetic layer consists of one nonmagnetic layer and the at least one pinned layer consists of one pinned layer, and that the sensor has a multi-layered structure of an under layer, the one pinned layer, the one nonmagnetic layer and the free layer sequentially layered in this order from a substrate side.

It is preferred that the at least one nonmagnetic layer consists of first and second nonmagnetic layers and the at least one pinned layer consists of first and second pinned layers, and that the sensor has a multi-layered structure of an under layer, the first pinned layer, the first nonmagnetic layer, the free layer, the second nonmagnetic layer and the second pinned layer sequentially layered in this order from a substrate side.

Preferably, the under layer is oriented in (1, 1, 1) plane.

Also, preferably, the sensor further includes a protection layer being oriented in (1, 1, 1) plane.

The present invention further concerns a method of manufacturing a MR sensor and a method of manufacturing a thin-film magnetic head with the MR sensor. The MR sensor is fabricated by sequentially layering at least one pinned layer with a magnetization direction fixed, at least one nonmagnetic layer and a free layer with a magnetization direction variable depending upon a magnetic field applied to the free layer. The method includes a step of forming a mutual diffusion layer substantially made of a nonmagnetic metal, and a step of diffusing the nonmagnetic metal in at least part of the free layer.

It is preferred that the forming step includes forming the mutual diffusion layer in the middle of the free layer, or forming the mutual diffusion layer on one face of the free layer, the other face of the free layer being in contact with the at least one nonmagnetic layer.

It is also preferred that the forming step includes forming the mutual diffusion layer with a thickness of 0.1 to 0.5 nm.

It is further preferred that the metal contains at least one component selected from a group of Al, Si, Ti, V, Cr, Mn, Ga, Ge, Y, Zr, Nb, Mo, Ru, Rh, Pd, In, Sn, Hf, Ta, W, Re, Os, Ir and Pt.

It is preferred that the method further includes a step of forming at least one anti-ferromagnetic layer for fixing the magnetization direction of the at least one pinned layer using a bias magnetic field due to exchange coupling, the at least one anti-ferromagnetic layer being layered to contact with the at least one pinned layer. In this case, preferably, the at least one pinned layer has a single layer structure including a ferromagnetic layer, a multi-layered structure including ferromagnetic layers, or a multi-layered structure including ferromagnetic layers and a nonmagnetic layer.

It is preferred that the method further includes a step of forming the at least one pinned layer as a multi-layered structure including at least two ferromagnetic layers that are anti-ferromagnetically coupled with each other to have magnetic moments in opposite directions. Since the magnetization is automatically fixed, no anti-ferromagnetic layer for pinning by exchange coupling the pinned layer is needed.

It is also preferred that the method further includes a step of forming the at least one pinned layer as at least one ferromagnetic layer, a magnetization of the at least one ferromagnetic layer being fixed by a magnetic field produced due to a current flowing through the sensor. Since the magnetization is fixed by the bias magnetic field due to the sense current, no anti-ferromagnetic layer for pinning by exchange coupling the pinned layer is needed.

It is preferred that the method further includes a step of sequentially layering in this order from a substrate side, an under layer, a free layer with a magnetization direction variable depending upon a magnetic field applied to the free layer, a nonmagnetic layer and a pinned layer with a magnetization direction fixed.

It is preferred that the method further includes a step of sequentially layering in this order from a substrate side, an under layer, a pinned layer with a magnetization direction fixed, a nonmagnetic layer and a free layer with a magnetization direction variable depending upon a magnetic field applied to the free layer.

It is preferred that the method further includes a step of sequentially layering in this order from a substrate side, an under layer, a first pinned layer with a magnetization direction fixed, a first nonmagnetic layer, a free layer with a magnetization direction variable depending upon a magnetic field applied to the free layer, a second nonmagnetic layer and a second pinned layer with a magnetization direction fixed.

Preferably, the under layer is oriented in (1, 1, 1) plane.

Also, preferably, the method further includes a step of forming a protection layer oriented in (1, 1, 1) plane.

Further objects and advantages of the present invention will be apparent from the following description of the preferred embodiments of the invention as illustrated in the accompanying drawings.

DESCRIPTION OF THE PREFERRED EMBODIMENTS

First Embodiment

Figure 1:
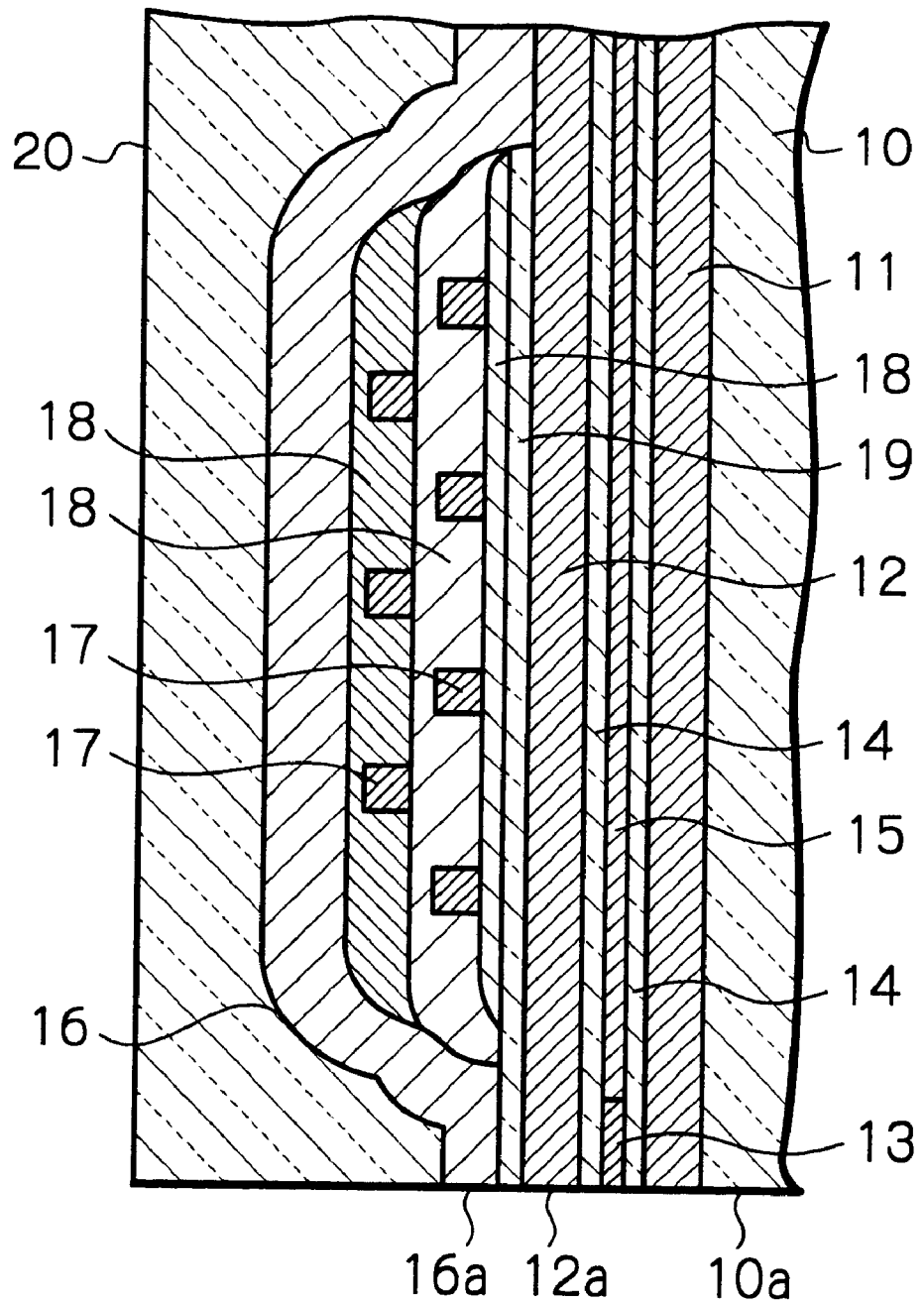
FIG. 1 shows a cross-sectional view schematically illustrating a main portion of a thin-film magnetic head in a first embodiment according to the present invention.
Figure 2:
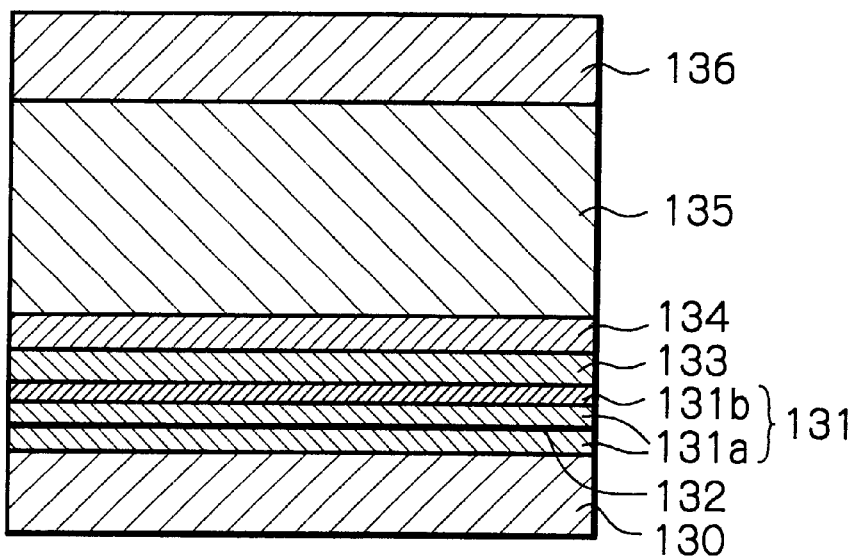
FIG. 2 shows a sectional view seen from an air bearing surface (ABS) illustrating a layer configuration of a SVMR multi-layered structure shown in FIG. 1.

FIG. 1 schematically illustrates a main portion of a thin-film magnetic head in a first embodiment according to the present invention, and FIG. 2 illustrates a layer configuration of a SVMR multi-layered structure shown in FIG. 1. The thin-film magnetic head in this embodiment is a composite or integral thin-film magnetic head with a read head part configured by a MR sensor and a write head part configured by an inductive magnetic transducer.

In the figure, reference numeral 10 denotes a substrate constituting the most part of a slider, 11 a lower shield layer formed on an under layer (not shown) that covers the substrate 10, 12 an upper shield layer also operating as a lower magnetic layer of the write head part, 13 a SVMR multi-layered structure formed to run along an ABS 10a between the lower and upper shield layers 11 and 12 via insulation layers 14 and 15, 16 an upper magnetic layer, 17 a coil conductor layer surrounded by an insulation layer made of an organic resin material, 19 a gap layer and 20 a protection layer, respectively.

Top end portions of the lower and upper magnetic layers 12 and 16 configure magnetic poles 12a and 16a faced with each other via the very thin gap layer 19 to perform write operation. The opposite ends of the lower and upper magnetic layers or yokes 12 and 16 with respect to the magnetic poles 12a and 16a configure back gaps and coupled with each other to complete a magnetic circuit. The coil conductor layer 17 is formed on the insulation layer 18 to spirally wind around the coupled portion of the yokes 12 and 16.

As shown in FIG. 2, the SVMR multi-layered structure 13 has a structure formed by sequentially layering an under layer 130, a soft magnetic layer 131a that constitutes a part of a free layer 131, a mutual diffusion layer 132 inserted in the middle of the soft magnetic layer 131a, a soft magnetic layer 131b that constitutes a part of the free layer 131, a nonmagnetic conductive layer 133, a pinned layer 134, an anti-ferromagnetic layer 135 and a protection layer 136. It should be noted that, after annealing, a metallic composition of the mutual diffusion layer 132 is diffused in the soft magnetic layer 131a of the free layer 131 and also a metallic composition of the soft magnetic layer 131a is diffused in the mutual diffusion layer 132.

The under layer 130 has a face-centered cubic crystal structure and oriented in (1, 1, 1) plane. More particularly, the under layer 130 can be formed by a NiCr film with a thickness of for example about 5 nm. It is possible to form the under layer 130 by an alloy film of at least one component selected from a group of Ni, Fe, Co and Cu and at least one component selected from a group of Cr, Al, Mn, Ir, Mo and V.

In this embodiment, the free layer 131 has the multi-layered structure with two layers of the soft magnetic layers 131a and 131b. However, the free layer 131 may be formed in a single layer structure or a multi-layered structure with three or more layers. As for the soft magnetic layer 131a, NiFe films with thicknesses of for example about 1.5 nm+1.5 nm may be used, and as for the soft magnetic layer 131b, a CoFe film with a thickness of for example about 1 nm may be used. A Co film may be used for the soft magnetic layer 131b.

One face of the nonmagnetic conductive layer 133 is contacted with one face of the soft magnetic layer 131b. This conductive layer 133 is formed by a Cu film with a thickness of for example about 2.1 nm.

One face of the pinned layer 134 is contacted with the other face of the nonmagnetic conductive layer 133. This pinned layer 134 is formed by a single layer of a ferromagnetic material, for example, a CoFe film with a thickness of about 2 nm. A Co film may be used for the pinned layer 134. The pinned layer 134 may be formed by a multi-layered structure of a ferromagnetic material.

The anti-ferromagnetic layer 135 is formed by a PtMn film with a thickness of for example about 20 nm. The pinned layer 134 is exchange-coupled with the anti-ferromagnetic layer 135 so as to be magnetized to one fixed direction. A NiMn film, a RuRh film, a Mn film or a IrMn film may be used as for the anti-ferromagnetic layer 135. The anti-ferromagnetic layer 135 may contain at least one component selected from a group of Ru, Rh, Pd, Au, Ag, Fe and Cr.

The protection layer 136 has a face-centered cubic crystal structure and oriented in (1, 1, 1) plane. More particularly, the protection layer 136 can be formed by a NiCr film with a thickness of for example about 5 nm. It is possible to form the protection layer 136 by an alloy film of at least one component selected from a group of Ni, Fe, Co and Cu and at least one component selected from a group of Cr, Al, Mn, Ir, Mo and V.

Each above-mentioned layer except for the anti-ferromagnetic layer 135 has a (1, 1, 1) plane spacing in a range of 0.2050–0.2064 nm, preferably in a range of 0.2054–0.2063 nm, more preferably in a range of 0.2055–0.2062 nm.

According to the SVMR multi-layered structure having such crystal structure, since the (1, 1, 1) plane spacing of the under layer 130 coincides with the (1, 1, 1) plane spacing of the NiFe film and with the (1, 1, 1) plane spacing of the other film of the free layer 131 having the face-centered cubic crystal structure, no turbulence occurs at each surface of the SVMR multi-layered structure and thus a MR ratio of 10% or more can be obtained. Also, variation in an asymmetry characteristics can be greatly improved.

As for the mutual diffusion layer 132 inserted in the middle of the soft magnetic layer 131a of the free layer 131, a Ta film with a thickness of for example about 0.1–0.5 nm can be used. It is possible to form the mutual diffusion layer 132 by a metal film containing at least one component selected from a group of Al, Si, Ti, V, Cr, Mn, Ga, Ge, Y, Zr, Nb, Mo, Ru, Rh, Pd, In, Sn, Hf, Ta, W, Re, Os, Ir and PT. After annealing, a metallic composition of the soft magnetic layer 131a is diffused in the mutual diffusion layer 132. Contrary to this, after annealing, a metallic composition of the mutual diffusion layer 132 is diffused in the soft magnetic layer 131a of the free layer 131.

Although it is not illustrated in FIG. 2, magnetic domain control layers for applying a longitudinal magnetic bias to the free layer 131 are formed at both end faces of the SVMR multi-layered structure. The magnetic domain control layer may be a permanent magnetic layer or an anti-ferromagnetic layer formed to produce exchange coupling between this anti-ferromagnetic layer and the free layer 131. Lead conductor layers for flowing a sense current through the nonmagnetic conductive layer 133 of the SVMR multi-layered structure are layered on the magnetic domain control layers, respectively.

Following is manufacturing processes of the SVMR multi-layered structure 13 in this embodiment. First, as shown in FIG. 2, on the substrate, the under layer 130 (NiCr, 5 nm), a part of the soft magnetic layer 131a (NiFe, 1.5 nm) of the free layer 131, the mutual diffusion layer 132 (Ta, 0.1–0.5 nm), the remaining part of the soft magnetic layer 131a (NiFe, 1.5 nm), the soft magnetic layer 131b (CoFe, 1 nm) of the free layer 131, the nonmagnetic conductive layer 133 (Cu, 2.1 nm), the pinned layer 134 (CoFe, 2 nm), the anti-ferromagnetic layer 135 (PtMn, 20 nm) and the protection layer 136 (NiCr, 5 nm) are sequentially layered.

Then, an annealing process for holding a temperature of 260° C. for five hours under applying a magnetic field of 300 mT (3 kG). By this annealing process, a metallic composition of the soft magnetic layer 131a is diffused in the mutual diffusion layer 132, and also a metallic composition of the mutual diffusion layer 132 is diffused in the soft magnetic layer 131a.

Other processes for fabricating a composite thin-film magnetic head are the same as these of the conventional processes.

Figure 3:
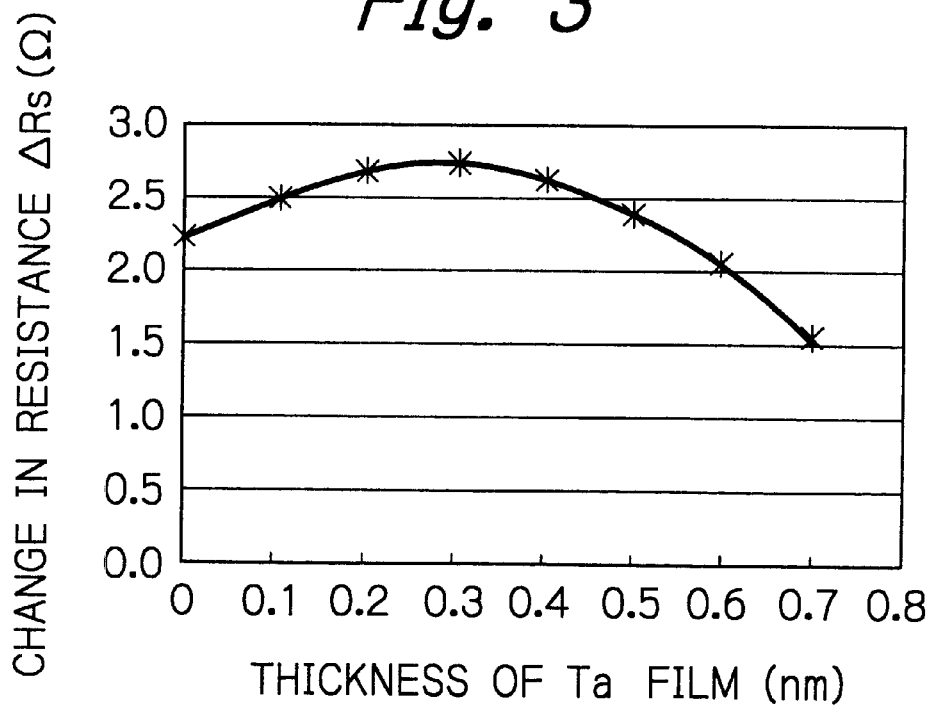
FIG. 3 shows a graph illustrating a measured result of a change in MR resistance ΔRs with respect to a thickness of a Ta film.
Figure 4:
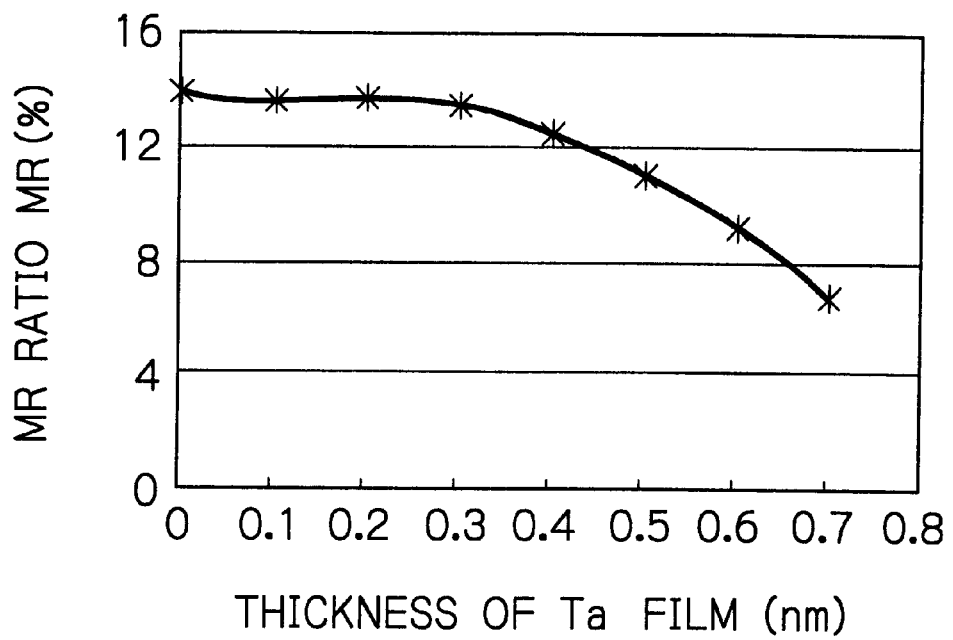
FIG. 4 shows a graph illustrating a measured result of a MR ratio MR with respect to a thickness of a Ta film.
Figure 5:
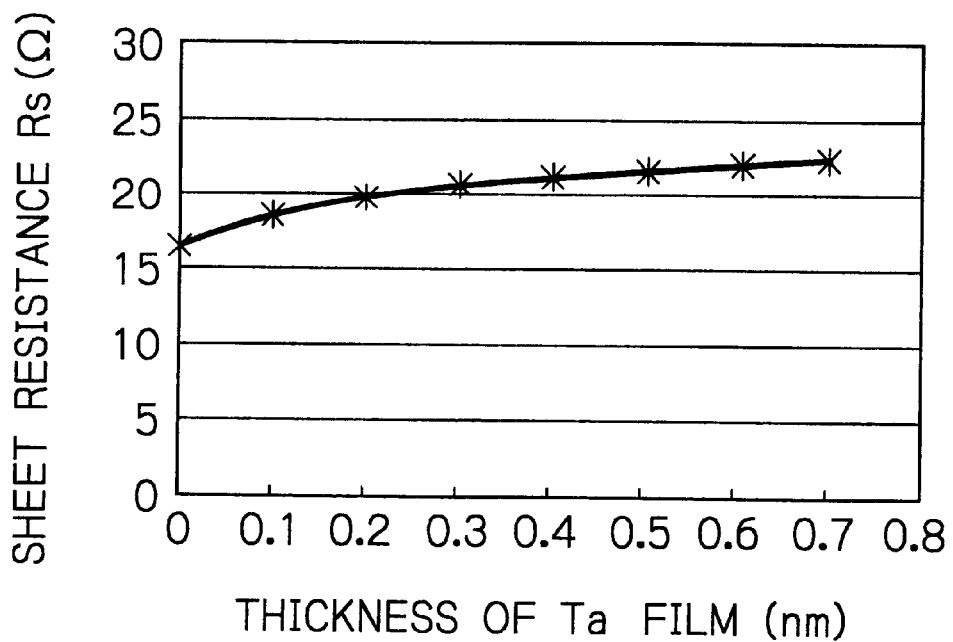
FIG. 5 shows a graph illustrating a measured result of a sheet resistance Rs with respect to a thickness of a Ta film.

FIGS. 3 to 5 illustrate measured results of a change in MR resistance ΔRs, a MR ratio MR and a sheet resistance Rs of thus obtained SVMR sensor with respect to a thickness of a Ta film that is the mutual diffusion layer 132. The applied magnetic field during the measurement was 72,000 A/m (900 Oe).

As will be noted from these figures, by forming the mutual diffusion layer 132, the MR ratio somewhat decreases when the thickness of the layer 132 increases. This MR ratio is kept 10% or more when the thickness of the layer 132 is 0.5 nm or less. However, by forming the mutual diffusion layer 132, since a metallic component in the mutual diffusion layer 132 is diffused into the free layer 131, the sheet resistance Rs increases and thus the change in MR resistance ΔRs increases. The MR resistance change ΔRs is kept above 2.5 Ω when the thickness of the Ta film is 0.1–0.5 nm.

Table 1 indicates measured MR resistance change ΔRs of various samples of SVMR sensor having the same multi-layered structure as this embodiment but the mutual diffusion layer of different material with each other.

To obtain each sample, NiCr (5 nm)/a free layer with an inserted mutual diffusion layer/Cu (2.1 nm)/CoFe (2 nm)/

PtMn (20 nm)/NiCr (5 nm) were sequentially deposited on a substrate of AlTiC with an alumina film, and then the deposited layers were annealed by holding a temperature of 260° C. for five hours under applying a magnetic field of 300 mT (3 kG). The applied magnetic field during the measurement was 72,000 A/m (900 Oe).

TABLE 1

| Free layer with inserted mutual diffusion layer | ΔRs |
|---|---|
| NiFe(3 nm)/CoFe(1 nm) (comparison example) | 2.23 |
| NiFe(1.5 nm)/Ta(0.2 nm)/NiFe(1.5 nm)/CoFe(1 nm) | 2.70 |
| NiFe(1.5 nm)/Al(0.2 nm)/NiFe(1.5 nm)/CoFe(1 nm) | 2.61 |
| NiFe(1.5 nm)/Si(0.2 nm)/NiFe(1.5 nm)/CoFe(1 nm) | 2.63 |
| NiFe(1.5 nm)/Ti(0.2 nm)/NiFe(1.5 nm)/CoFe(1 nm) | 2.55 |
| NiFe(1.5 nm)/V(0.2 nm)/NiFe(1.5 nm)/CoFe(1 nm) | 2.63 |
| NiFe(1.5 nm)/Cr(0.2 nm)/NiFe(1.5 nm)/CoFe(1 nm) | 2.64 |
| NiFe(1.5 nm)/Mn(0.2 nm)/NiFe(1.5 nm)/CoFe(1 nm) | 2.68 |
| NiFe(1.5 nm)/Ga(0.2 nm)/NiFe(1.5 nm)/CoFe(1 nm) | 2.70 |
| NiFe(1.5 nm)/Ge(0.2 nm)/NiFe(1.5 nm)/CoFe(1 nm) | 2.69 |
| NiFe(1.5 nm)/Y(0.2 nm)/NiFe(1.5 nm)/CoFe(1 nm) | 2.66 |
| NiFe(1.5 nm)/Zr(0.2 nm)/NiFe(1.5 nm)/CoFe(1 nm) | 2.61 |
| NiFe(1.5 nm)/Nb(0.2 nm)/NiFe(1.5 nm)/CoFe(1 nm) | 2.60 |
| NiFe(1.5 nm)/Mo(0.2 nm)/NiFe(1.5 nm)/CoFe(1 nm) | 2.68 |
| NiFe(1.5 nm)/Ru(0.2 nm)/NiFe(1.5 nm)/CoFe(1 nm) | 2.50 |
| NiFe(1.5 nm)/Rh(0.2 nm)/NiFe(1.5 nm)/CoFe(1 nm) | 2.55 |
| NiFe(1.5 nm)/Pd(0.2 nm)/NiFe(1.5 nm)/CoFe(1 nm) | 2.66 |
| NiFe(1.5 nm)/In(0.2 nm)/NiFe(1.5 nm)/CoFe(1 nm) | 2.64 |
| NiFe(1.5 nm)/Sn(0.2 nm)/NiFe(1.5 nm)/CoFe(1 nm) | 2.51 |
| NiFe(1.5 nm)/Hf(0.2 nm)/NiFe(1.5 nm)/CoFe(1 nm) | 2.61 |
| NiFe(1.5 nm)/W(0.2 nm)/NiFe(1.5 nm)/CoFe(1 nm) | 2.52 |
| NiFe(1.5 nm)/Pt(0.2 nm)/NiFe(1.5 nm)/CoFe(1 nm) | 2.63 |
| NiFe(1.5 nm)/Re(0.2 nm)/NiFe(1.5 nm)/CoFe(1 nm) | 2.58 |
| NiFe(1.5 nm)/Os(0.2 nm)/NiFe(1.5 nm)/CoFe(1 nm) | 2.60 |
| NiFe(1.5 nm)/Ir(0.2 nm)/NiFe(1.5 nm)/CoFe(1 nm) | 2.60 |
| NiFe(1.5 nm)/TaCo(0.3 nm)/NiFe(1.5 nm)/CoFe(1 nm) | 2.64 |
| NiFe(1.5 nm)/TaNi(0.3 nm)/NiFe(1.5 nm)/CoFe(1 nm) | 2.62 |
| NiFe(1.5 nm)/TaFe(0.3 nm)/NiFe(1.5 nm)/CoFe(1 nm) | 2.66 |

In the aforementioned first embodiment, the mutual diffusion layer 132 is inserted at the middle of the soft magnetic layer 131a of the free layer 131. However, this mutual diffusion layer 132 can be inserted at any position along the thickness direction in the soft magnetic layer 131a.

Table 2 indicates measured MR resistance change ΔRs of various samples of SVMR sensor having the mutual diffusion layer inserted at the different position.

TABLE 2

| Free layer with inserted mutual diffusion layer | ΔRs |
|---|---|
| NiFe(3 nm)/CoFe(1 nm) (comparison example) | 2.23 |
| NiFe(0.5 nm)/Ta(0.3 nm)/NiFe(2.5 nm)/CoFe(1 nm) | 2.65 |
| NiFe(1 nm)/Ta(0.3 nm)/NiFe(2 nm)/CoFe(1 nm) | 2.74 |
| NiFe(1.5 nm)/Ta(0.3 nm)/NiFe(1.5 nm)/CoFe(1 nm) | 2.75 |
| NiFe(2 nm)/Ta(0.3 nm)/NiFe(1 nm)/CoFe(1 nm) | 2.73 |
| NiFe(2.5 nm)/Ta(0.3 nm)/NiFe(0.5 nm)/CoFe(1 nm) | 2.58 |
| NiFe(2 nm)/CoFe(2 nm) (comparison example) | 2.20 |
| NiFe(0.5 nm)/Ta(0.2 nm)/NiFe(1.5 nm)/CoFe(2 nm) | 2.72 |
| NiFe(1 nm)/Ta(0.2 nm)/NiFe(1 m)/CoFe(2 nm) | 2.75 |
| NiFe(1.5 nm)/Ta(0.2 nm)/NiFe(0.5 nm)/CoFe(2 nm) | 2.71 |

Second Embodiment

Figure 6:
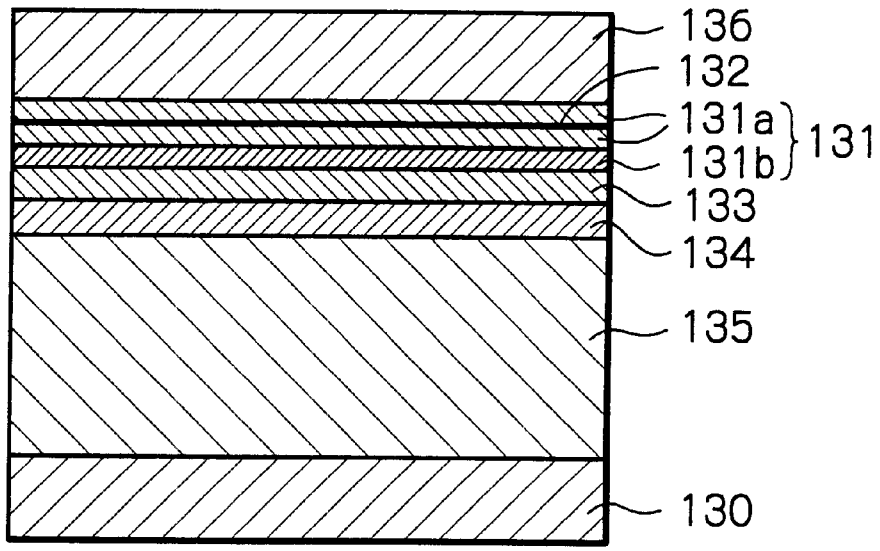
FIG. 6 shows a sectional view seen from an ABS illustrating a layer configuration of a SVMR multi-layered structure in a second embodiment according to the present invention.

FIG. 6 illustrates a layer configuration of a SVMR multi-layered structure in a second embodiment according to the present invention.

In this second embodiment, the SVMR multi-layered structure has a structure formed by sequentially layering an under layer 130, an anti-ferromagnetic layer 135, a pinned layer 134, a nonmagnetic conductive layer 133, a soft magnetic layer 131b that constitutes a part of a free layer 131, a soft magnetic layer 131a that constitutes a part of the free layer 131, a mutual diffusion layer 132 inserted in the middle of the soft magnetic layer 131a and a protection layer 136. It should be noted that, after annealing, a metallic composition of the mutual diffusion layer 132 is diffused in the soft magnetic layer 131a of the free layer 131 and also a metallic composition of the soft magnetic layer 131a is diffused in the mutual diffusion layer 132.

The SVMR multi-layered structure in this second embodiment has an opposite layering order as that of the first embodiment. Another constitutions, operations and advantages in this second embodiment are the same as those of the first embodiment and therefore a MR resistance change ΔRs substantially above 2.5 Ω can be obtained. In FIG. 6, the same reference numerals are used for the same elements as those in FIG. 2, respectively.

Table 3 indicates measured MR resistance change ΔRs of various samples of SVMR sensor having the same multi-layered structure as this embodiment but the mutual diffusion layer of different material with each other.

To obtain each sample, NiCr (5 nm)/PtMn (20 nm)/CoFe (2 nm)/Cu (2.1 nm)/a free layer with an inserted mutual diffusion layer/NiCr (5 nm) were sequentially deposited on a substrate of AlTiC with an alumina film, and then the deposited layers were annealed by holding a temperature of 260° C. for five hours under applying a magnetic field of 300 mT (3 kG). The applied magnetic field during the measurement was 72,000 A/m (900 Oe).

TABLE 3

| Free layer with inserted mutual diffusion layer | ΔRs |
|---|---|
| CoFe(1 nm)/NiFe(3 nm) (comparison example) | 2.42 |
| CoFe(1 nm)/NiFe(1.5 nm)/Ta(0.2 nm)/NiFe(1.5 nm) | 2.90 |
| CoFe(1 nm)/NiFe(1.5 nm)/Al(0.2 nm)/NiFe(1.5 nm) | 2.80 |
| CoFe(1 nm)/NiFe(1.5 nm)/Si(0.2 nm)/NiFe(1.5 nm) | 2.83 |
| CoFe(1 nm)/NiFe(1.5 nm)/Ti(0.2 nm)/NiFe(1.5 nm) | 2.74 |
| CoFe(1 nm)/NiFe(1.5 nm)/V(0.2 nm)/NiFe(1.5 nm) | 2.83 |
| CoFe(1 nm)/NiFe(1.5 nm)/Cr(0.2 nm)/NiFe(1.5 nm) | 2.64 |
| CoFe(1 nm)/NiFe(1.5 nm)/Mn(0.2 nm)/NiFe(1.5 nm) | 2.84 |
| CoFe(1 nm)/NiFe(1.5 nm)/Ga(0.2 nm)/NiFe(1.5 nm) | 2.88 |
| CoFe(1 nm)/NiFe(1.5 nm)/Ge(0.2 nm)/NiFe(1.5 nm) | 2.90 |
| CoFe(1 nm)/NiFe(1.5 nm)/Y(0.2 nm)/NiFe(1.5 nm) | 2.89 |
| CoFe(1 nm)/NiFe(1.5 nm)/Zr(0.2 nm)/NiFe(1.5 nm) | 2.85 |
| CoFe(1 nm)/NiFe(1.5 nm)/Nb(0.2 nm)/NiFe(1.5 nm) | 2.80 |
| CoFe(1 nm)/NiFe(1.5 nm)/Mo(0.2 nm)/NiFe(1.5 nm) | 2.79 |
| CoFe(1 nm)/NiFe(1.5 nm)/Ru(0.2 nm)/NiFe(1.5 nm) | 2.88 |
| CoFe(1 nm)/NiFe(1.5 nm)/Rh(0.2 nm)/NiFe(1.5 nm) | 2.69 |
| CoFe(1 nm)/NiFe(1.5 nm)/Pd(0.2 nm)/NiFe(1.5 nm) | 2.74 |
| CoFe(1 nm)/NiFe(1.5 nm)/In(0.2 nm)/NiFe(1.5 nm) | 2.86 |
| CoFe(1 nm)/NiFe(1.5 nm)/Sn(0.2 nm)/NiFe(1.5 nm) | 2.84 |
| CoFe(1 nm)/NiFe(1.5 nm)/Hf(0.2 nm)/NiFe(1.5 nm) | 2.70 |
| CoFe(1 nm)/NiFe(1.5 nm)/W(0.2 nm)/NiFe(1.5 nm) | 2.81 |
| CoFe(1 nm)/NiFe(1.5 nm)/Pt(0.2 nm)/NiFe(1.5 nm) | 2.71 |
| CoFe(1 nm)/NiFe(1.5 nm)/Re(0.2 nm)/NiFe(1.5 nm) | 2.77 |
| CoFe(1 nm)/NiFe(1.5 nm)/Os(0.2 nm)/NiFe(1.5 nm) | 2.79 |
| CoFe(1 nm)/NiFe(1.5 nm)/Ir(0.2 nm)/NiFe(1.5 nm) | 2.79 |

Third Embodiment

Figure 7:
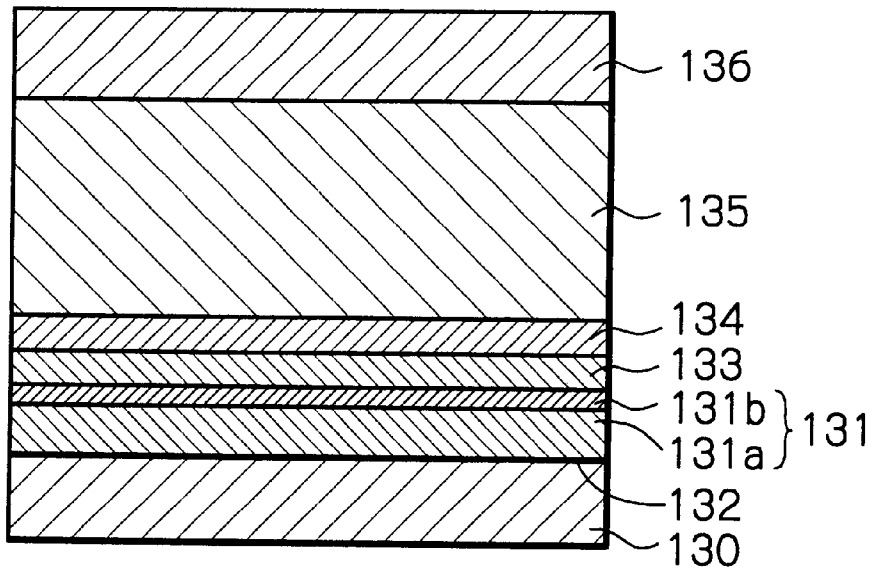
FIG. 7 shows a sectional view seen from an ABS illustrating a layer configuration of a SVMR multi-layered structure in a third embodiment according to the present invention.

FIG. 7 illustrates a layer configuration of a SVMR multi-layered structure in a third embodiment according to the present invention.

In this third embodiment, the SVMR multi-layered structure has a structure formed by sequentially layering an under layer 130, a mutual diffusion layer 132, soft magnetic layers 131a and 131b that constitute a free layer 131, a nonmagnetic conductive layer 133, a pinned layer 134, an anti-ferromagnetic layer 135 and a protection layer 136. It should be noted that, after annealing, a metallic composition of the mutual diffusion layer 132 is diffused in the soft magnetic layer 131a of the free layer 131 and metallic compositions of the soft magnetic layer 131a and the under layer 130 are diffused in the mutual diffusion layer 132.

In this embodiment, the mutual diffusion layer 132 is inserted between the under layer 130 and the soft magnetic layer 131a of the free layer 131. Another constitutions, operations and advantages in this third embodiment are the same as those of the first embodiment and therefore a MR resistance change ΔRs substantially above 2.5 Ω can be obtained. In FIG. 7, the same reference numerals are used for the same elements as those in FIG. 2, respectively.

Table 4 indicates measured MR resistance change ΔRs of various samples of SVMR sensor having the soft magnetic layers of the free layer and the mutual diffusion layer with different thicknesses, respectively.

TABLE 4

| Free layer with inserted mutual diffusion layer | ΔRs |
| --- | --- |
| NiFe(3 nm)/CoFe(1 nm) (comparison example) | 2.23 |
| NiFe(0 nm)/Ta(0.3 nm)/NiFe(3 nm)/CoFe(1 nm) | 2.51 |
| NiFe(2 nm)/CoFe(2 nm) (comparison example) | 2.20 |
| NiFe(0 nm)/Ta(0.2 nm)/NiFe(2 nm)/CoFe(2 nm) | 2.61 |

Fourth Embodiment

Figure 8:
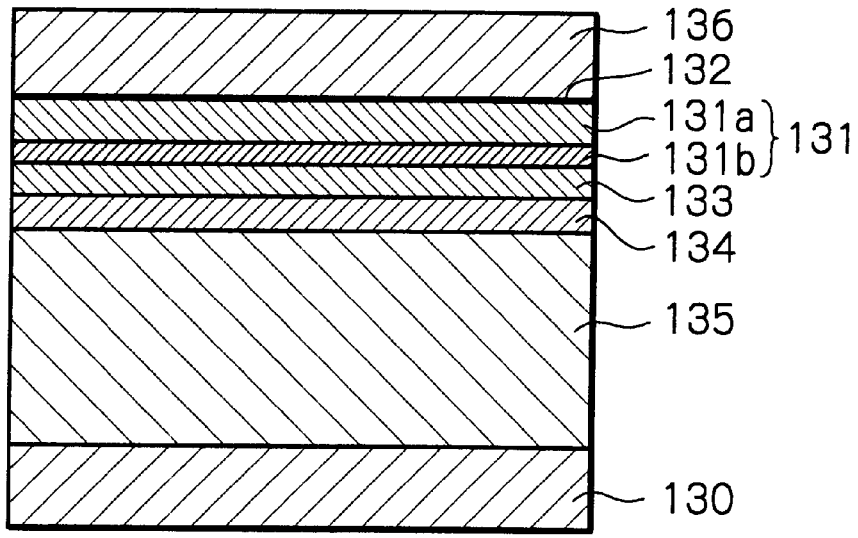
FIG. 8 shows a sectional view seen from an ABS illustrating a layer configuration of a SVMR multi-layered structure in a fourth embodiment according to the present invention.

FIG. 8 illustrates a layer configuration of a SVMR multi-layered structure in a fourth embodiment according to the present invention.

In this fourth embodiment, the SVMR multi-layered structure has a structure formed by sequentially layering an under layer 130, an anti-ferromagnetic layer 135, a pinned layer 134, a nonmagnetic conductive layer 133, soft magnetic layers 131b and 131a that constitute a free layer 131, a mutual diffusion layer 132 layered on the soft magnetic layer 131a and a protection layer 136. It should be noted that, after annealing, a metallic composition of the mutual diffusion layer 132 is diffused in the soft magnetic layer 131a of the free layer 131 and metallic compositions of the soft magnetic layer 131a and the protection layer 136 are diffused in the mutual diffusion layer 132.

The SVMR multi-layered structure in this fourth embodiment has an opposite layering order as that of the third embodiment. Another constitutions, operations and advantages in this fourth embodiment are the same as those of the third embodiment and therefore a MR resistance change ΔRs substantially above 2.5 Ω can be obtained. In FIG. 8, the same reference numerals are used for the same elements as those in FIG. 7, respectively.

Fifth Embodiment

Figure 9:
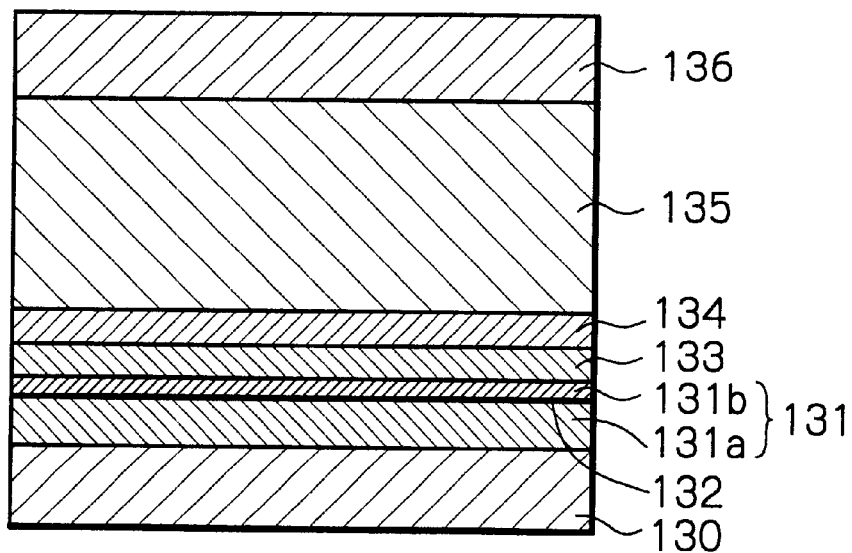
FIG. 9 shows a sectional view seen from an ABS illustrating a layer configuration of a SVMR multi-layered structure in a fifth embodiment according to the present invention.

FIG. 9 illustrates a layer configuration of a SVMR multi-layered structure in a fifth embodiment according to the present invention.

In this fifth embodiment, the SVMR multi-layered structure has a structure formed by sequentially layering an under layer 130, a soft magnetic layer 131a that constitutes a part of a free layer 131, a mutual diffusion layer 132 layered on the soft magnetic layer 131a, a soft magnetic layer 131b that constitutes a part of the free layer 131, a nonmagnetic conductive layer 133, a pinned layer 134, an anti-ferromagnetic layer 135 and a protection layer 136. It should be noted that, after annealing, a metallic composition of the mutual diffusion layer 132 is diffused in the soft magnetic layers 131a and 131b of the free layer 131 and metallic compositions of the soft magnetic layers 131a and 131b are diffused in the mutual diffusion layer 132.

In this embodiment, the mutual diffusion layer 132 is inserted between the soft magnetic layers 131a and 131b of the free layer 131. Another constitutions, operations and advantages in this fifth embodiment are the same as those of the first embodiment and therefore a MR resistance change ΔRs substantially above 2.5 Ω can be obtained. In FIG. 9, the same reference numerals are used for the same elements as those in FIG. 2, respectively.

Table 5 indicates measured MR resistance change ΔRs of various samples of SVMR sensor in this embodiment.

TABLE 5

| Free layer with inserted mutual diffusion layer | ΔRs |
| --- | --- |
| NiFe(2 nm)/CoFe(2 nm) (comparison example) | 2.61 |
| NiFe(2 nm)/Ta(0.2 nm)/NiFe(0 nm)/CoFe(2 nm) | 2.53 |

Sixth Embodiment

Figure 10:
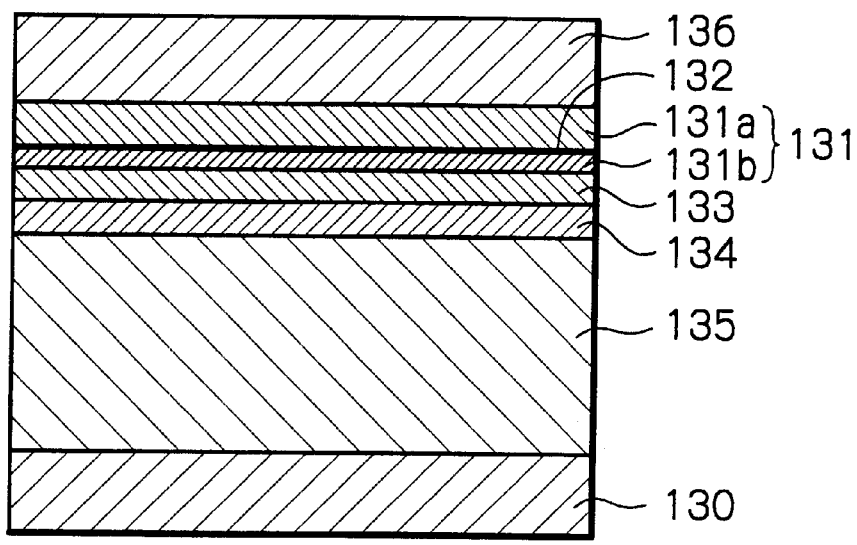
FIG. 10 shows a sectional view seen from an ABS illustrating a layer configuration of a SVMR multi-layered structure in a sixth embodiment according to the present invention.

FIG. 10 illustrates a layer configuration of a SVMR multi-layered structure in a sixth embodiment according to the present invention.

In this sixth embodiment, the SVMR multi-layered structure has a structure formed by sequentially layering an under layer 130, an anti-ferromagnetic layer 135, a pinned layer 134, a nonmagnetic conductive layer 133, a soft magnetic layer 131b that constitutes a part of a free layer 131, a mutual diffusion layer 132 layered on the soft magnetic layer 131b, a soft magnetic layer 131a that constitutes a part of the free layer 131 and a protection layer 136. It should be noted that, after annealing, a metallic composition of the mutual diffusion layer 132 is diffused in the soft magnetic layers 131a and 131b of the free layer 131 and metallic compositions of the soft magnetic layers 131a and 131b are diffused in the mutual diffusion layer 132.

The SVMR multi-layered structure in this sixth embodiment has an opposite layering order as that of the fifth embodiment. Another constitutions, operations and advantages in this sixth embodiment are the same as those of the fifth embodiment and therefore a MR resistance change ΔRs substantially above 2.5 Ω can be obtained. In FIG. 10, the same reference numerals are used for the same elements as those in FIG. 9, respectively.

Seventh Embodiment

Figure 11:
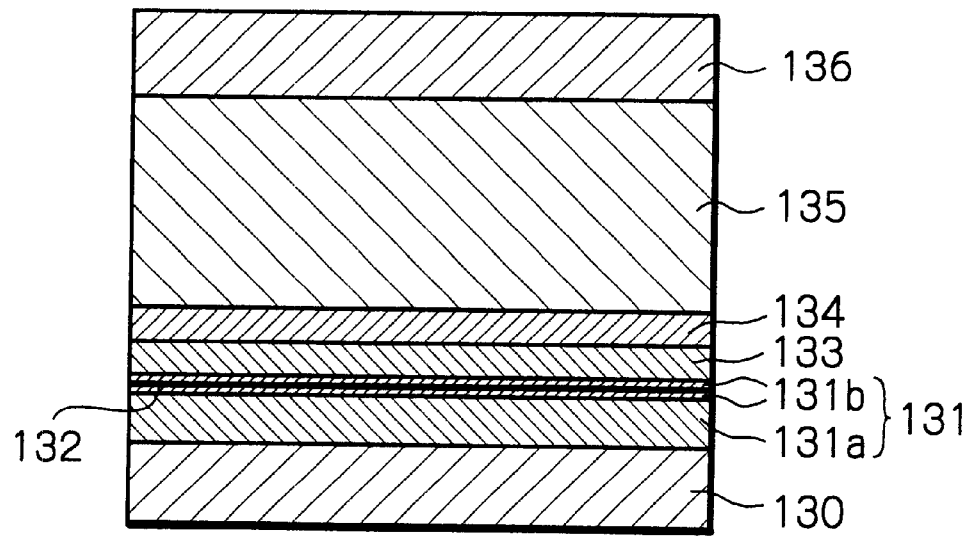
FIG. 11 shows a sectional view seen from an ABS illustrating a layer configuration of a SVMR multi-layered structure in a seventh embodiment according to the present invention.

FIG. 11 illustrates a layer configuration of a SVMR multi-layered structure in a seventh embodiment according to the present invention.

In this seventh embodiment, the SVMR multi-layered structure has a structure formed by sequentially layering an under layer 130, soft magnetic layers 131a and 131b that constitute a free layer 131, a mutual diffusion layer 132 inserted in the middle of the soft magnetic layer 131b, a nonmagnetic conductive layer 133, a pinned layer 134, an anti-ferromagnetic layer 135 and a protection layer 136. It should be noted that, after annealing, a metallic composition of the mutual diffusion layer 132 is diffused in the soft magnetic layer 131b of the free layer 131 and a metallic composition of the soft magnetic layer 131b is diffused in the mutual diffusion layer 132.

In this embodiment, the mutual diffusion layer 132 is inserted in the soft magnetic layer 131b of the free layer 131. Another constitutions, operations and advantages in this seventh embodiment are the same as those of the first embodiment and therefore a MR resistance change ΔRs substantially above 2.5 Ω can be obtained. In FIG. 11, the same reference numerals are used for the same elements as those in FIG. 2, respectively.

Eighth Embodiment

Figure 12:
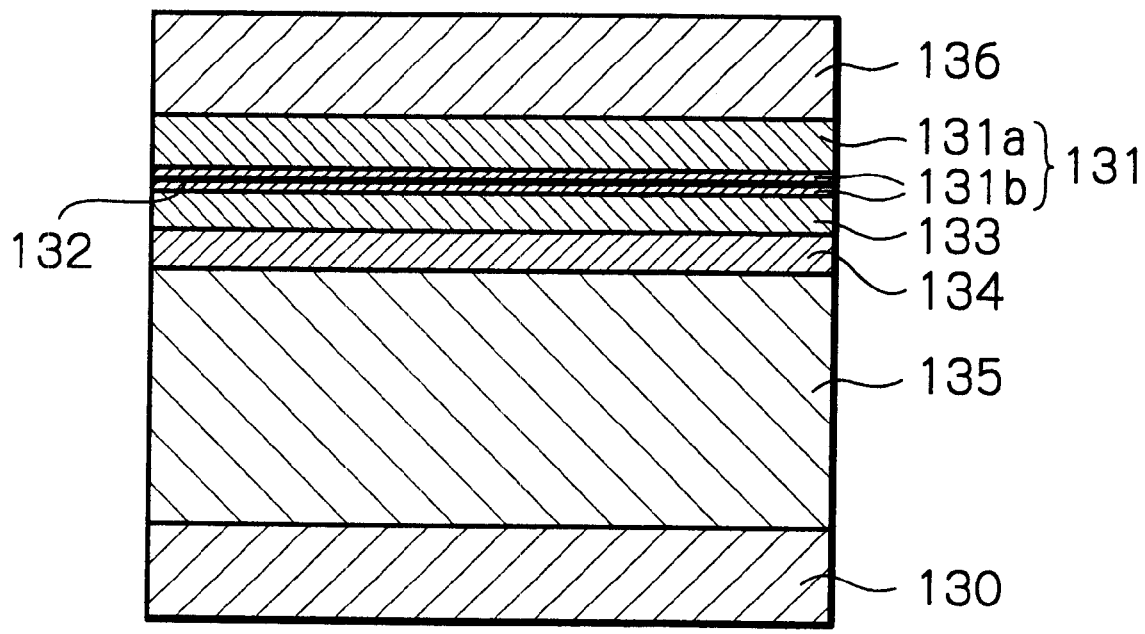
FIG. 12 shows a sectional view seen from an ABS illustrating a layer configuration of a SVMR multi-layered structure in an eighth embodiment according to the present invention.

FIG. 12 illustrates a layer configuration of a SVMR multi-layered structure in an eighth embodiment according to the present invention.

In this eighth embodiment, the SVMR multi-layered structure has a structure formed by sequentially layering an under layer 130, an anti-ferromagnetic layer 135, a pinned layer 134, a nonmagnetic conductive layer 133, a soft magnetic layer 131b that constitutes a part of a free layer 131, a mutual diffusion layer 132 inserted in the middle of the soft magnetic layer 131*b*, a soft magnetic layer 131*a* that constitutes a part of the free layer 131 and a protection layer 136. It should be noted that, after annealing, a metallic composition of the mutual diffusion layer 132 is diffused in the soft magnetic layer 131*b* of the free layer 131 and a metallic composition of the soft magnetic layer 131*b* is diffused in the mutual diffusion layer 132.

The SVMR multi-layered structure in this eighth embodiment has an opposite layering order as that of the seventh embodiment. Another constitutions, operations and advantages in this eighth embodiment are the same as those of the seventh embodiment and therefore a MR resistance change ΔRs substantially above 2.5 Ω can be obtained. In FIG. 12, the same reference numerals are used for the same elements as those in FIG. 11, respectively.

Ninth Embodiment

Figure 13:
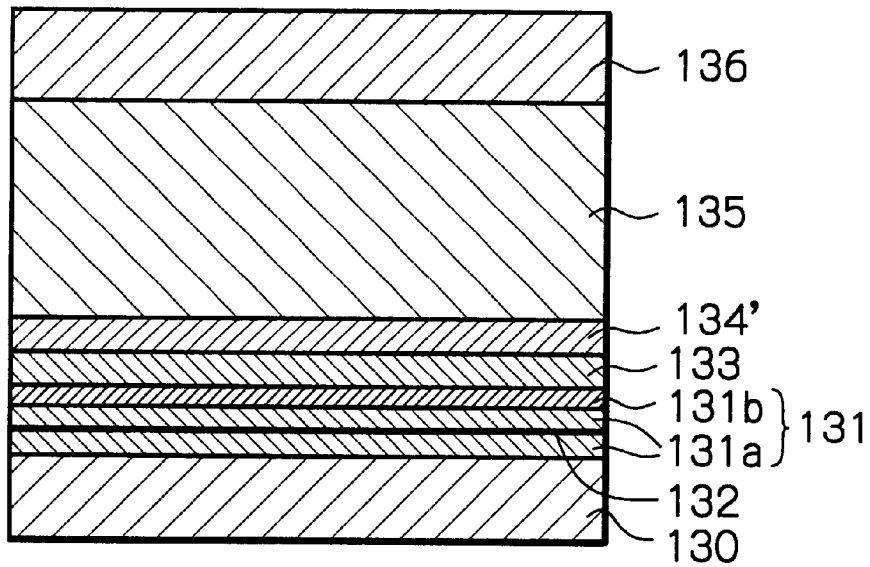
FIG. 13 shows a sectional view seen from an ABS illustrating a layer configuration of a SVMR multi-layered structure in a ninth embodiment according to the present invention.

FIG. 13 illustrates a layer configuration of a SVMR multi-layered structure in a ninth embodiment according to the present invention.

In this ninth embodiment, the SVMR multi-layered structure has a structure formed by sequentially layering an under layer 130, a soft magnetic layer 131*a* that constitutes a part of a free layer 131, a mutual diffusion layer 132 inserted in the middle of the soft magnetic layer 131*a*, a soft magnetic layer 131*b* that constitutes a part of the free layer 131, a nonmagnetic conductive layer 133, a pinned layer 134', an anti-ferromagnetic layer 135 and a protection layer 136. It should be noted that, after annealing, a metallic composition of the mutual diffusion layer 132 is diffused in the soft magnetic layer 131*a* of the free layer 131 and metallic composition of the soft magnetic layer 131*a* is diffused in the mutual diffusion layer 132.

The pinned layer 134' is not a single layer structure but a multi-layered structure with two ferromagnetic layers such as for example CoFe films and a nonmagnetic layer such as for example a Ru film inserted between the two ferromagnetic layers (synthetic structure).

In this embodiment, the structure of the pinned layer 134' is modified from that of the pinned layer 134 in the first embodiment. Another constitutions, operations and advantages in this ninth embodiment are the same as those of the first embodiment and therefore a MR resistance change ΔRs substantially above 2.5 Ω can be obtained. In FIG. 13, the same reference numerals are used for the same elements as those in FIG. 2, respectively.

Table 6 indicates measured MR resistance change ΔRs of various samples of SVMR sensor in this embodiment.

To obtain each sample, NiCr (5 nm)/a free layer with an inserted mutual diffusion layer/Cu (2 nm)/CoFe (2.5 nm)/Ru (0.8 nm)/CoFe (1.5 nm)/PtMn (13 nm)/Ta (5 nm) were sequentially deposited on a substrate of AlTiC with an alumina film, and then the deposited layers were annealed by holding a temperature of 260° C. for five hours under applying a magnetic field of 300 mT (3 kG). The applied magnetic field during the measurement was 72,000 A/m (900 Oe).

TABLE 6

| Free layer with inserted mutual diffusion layer | ΔRs |
|---|---|
| NiFe(3 nm)/CoFe(1 nm) (comparison example) | 2.15 |
| NiFe(1.5 nm)/Ta(0.2 nm)/NiFe(1.5 nm)/CoFe(1 nm) | 2.64 |

The pinned layer 134' may be formed in a specular spin valve structure with oxide layers sandwiching the synthetic structure of ferromagnetic layer/nonmagnetic layer/ferromagnetic layer.

Tenth Embodiment

Figure 14:
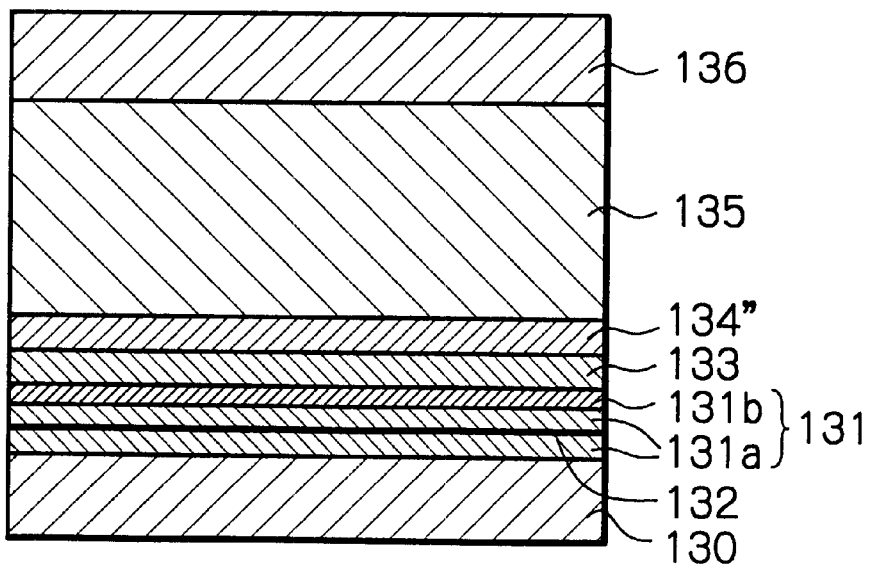
FIG. 14 shows a sectional view seen from an ABS illustrating a layer configuration of a SVMR multi-layered structure in a tenth embodiment according to the present invention.

FIG. 14 illustrates a layer configuration of a SVMR multi-layered structure in a tenth embodiment according to the present invention.

In this tenth embodiment, the SVMR multi-layered structure has a structure formed by sequentially layering an under layer 130, a soft magnetic layer 131*a* that constitutes a part of a free layer 131, a mutual diffusion layer 132 inserted in the middle of the soft magnetic layer 131*a*, a soft magnetic layer 131*b* that constitutes a part of the free layer 131, a nonmagnetic conductive layer 133, a pinned layer 134", an anti-ferromagnetic layer 135 and a protection layer 136. It should be noted that, after annealing, a metallic composition of the mutual diffusion layer 132 is diffused in the soft magnetic layer 131*a* of the free layer 131 and metallic composition of the soft magnetic layer 131*a* is diffused in the mutual diffusion layer 132.

The pinned layer 134" is not a single layer structure but a multi-layered structure with two ferromagnetic layers such as for example CoFe films and a nonmagnetic layer such as for example a Rh film inserted between the two ferromagnetic layers (synthetic structure).

In this embodiment, the structure of the pinned layer 134" is modified from that of the pinned layer 134 in the first embodiment. Another constitutions, operations and advantages in this tenth embodiment are the same as those of the first embodiment and therefore a MR resistance change ΔRs substantially above 2.5 Ω can be obtained. In FIG. 14, the same reference numerals are used for the same elements as those in FIG. 2, respectively.

Table 7 indicates measured MR resistance change ΔRs of various samples of SVMR sensor in this embodiment.

To obtain each sample, NiCr (5 nm)/a free layer with an inserted mutual diffusion layer/Cu (2 nm)/CoFe (2.5 nm)/Rh (0.6 nm)/CoFe (1.5 nm)/PtMn (13 nm)/Ta (5 nm) were sequentially deposited on a substrate of AlTiC with an alumina film, and then the deposited layers were annealed by holding a temperature of 260° C. for five hours under applying a magnetic field of 300 mT (3 kG). The applied magnetic field during the measurement was 72,000 A/m (900 Oe).

TABLE 7

| Free layer with inserted mutual diffusion layer | ΔRs |
|---|---|
| NiFe(3 nm)/CoFe(1 nm) (comparison example) | 2.21 |
| NiFe(1.5 nm)/Ta(0.2 nm)/NiFe(1.5 nm)/CoFe(1 nm) | 2.72 |

Eleventh Embodiment

Figure 15:
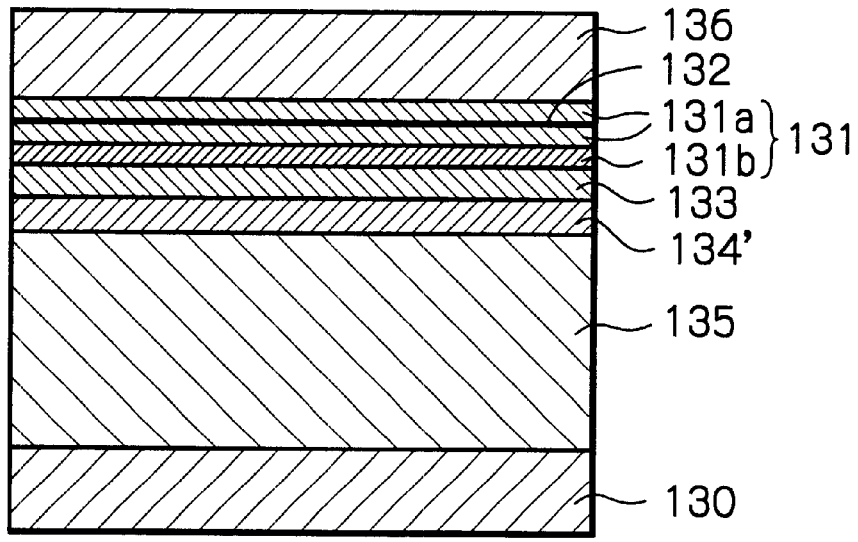
FIG. 15 shows a sectional view seen from an ABS illustrating a layer configuration of a SVMR multi-layered structure in an eleventh embodiment according to the present invention.

FIG. 15 illustrates a layer configuration of a SVMR multi-layered structure in an eleventh embodiment according to the present invention.

In this eleventh embodiment, the SVMR multi-layered structure has a structure formed by sequentially layering an under layer 130, an anti-ferromagnetic layer 135, a pinned layer 134', a nonmagnetic conductive layer 133, a soft magnetic layer 131*b* that constitutes a part of a free layer 131, a soft magnetic layer 131*a* that constitutes a part of the free layer 131, a mutual diffusion layer 132 inserted in the middle of the soft magnetic layer 131*a* and a protection layer 136. It should be noted that, after annealing, a metallic composition of the mutual diffusion layer 132 is diffused in the soft magnetic layer 131*a* of the free layer 131 and metallic composition of the soft magnetic layer 131*a* is diffused in the mutual diffusion layer 132.

The pinned layer 134' is not a single layer structure but a multi-layered structure with two ferromagnetic layers such as for example CoFe films and a nonmagnetic layer such as for example a Ru film inserted between the two ferromagnetic layers (synthetic structure).

The SVMR multi-layered structure in this eleventh embodiment has an opposite layering order as that of the ninth embodiment. Another constitutions, operations and advantages in this eleventh embodiment are the same as those of the ninth embodiment except for differences in layer thickness and therefore a MR resistance change ΔRs substantially above 2.5 Ω can be obtained. In FIG. 15, the same reference numerals are used for the same elements as those in FIG. 13, respectively.

Table 8 indicates measured MR resistance change ΔRs of various samples of SVMR sensor in this embodiment.

To obtain each sample, NiCr (5 nm)/PtMn (15 nm)/CoFe (1.3 nm)/Ru (0.8 nm)/CoFe (2 nm)/Cu (2 nm) a free layer with an inserted mutual diffusion layer/Ta (3 nm) were sequentially deposited on a substrate of AlTiC with an alumina film, and then the deposited layers were annealed by holding a temperature of 260° C. for five hours under applying a magnetic field of 300 mT (3 kG). The applied magnetic field during the measurement was 72,000 A/m (900 Oe).

TABLE 8

| Free layer with inserted mutual diffusion layer | ΔRs |
|---|---|
| CoFe(1 nm)/NiFe(3 nm) (comparison example) | 2.45 |
| CoFe(1 nm)/NiFe(1.5 nm)/Ta(0.2 nm)/NiFe(1.5 nm) | 2.88 |

Twelfth Embodiment

Figure 16:
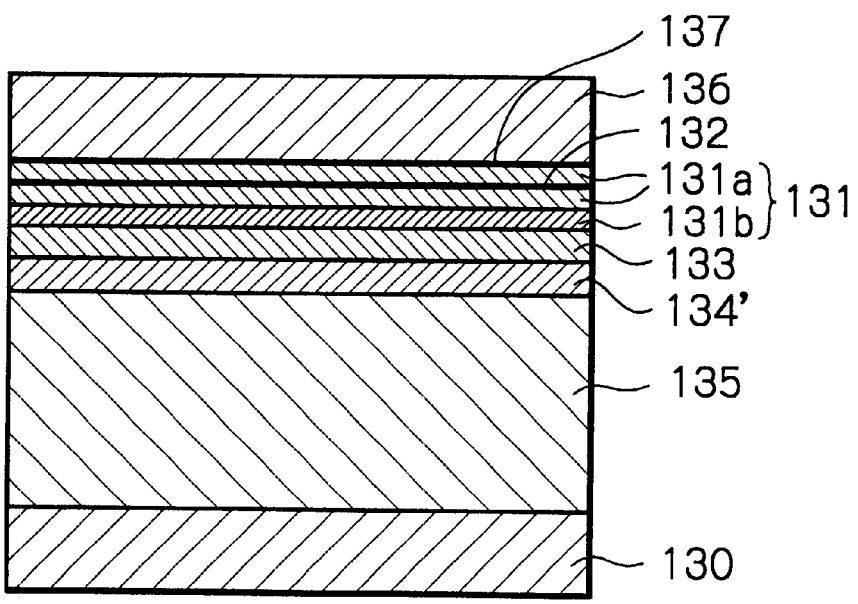
FIG. 16 shows a sectional view seen from an ABS illustrating a layer configuration of a SVMR multi-layered structure in a twelfth embodiment according to the present invention.

FIG. 16 illustrates a layer configuration of a SVMR multi-layered structure in a twelfth embodiment according to the present invention.

In this twelfth embodiment, the SVMR multi-layered structure has a structure formed by sequentially layering an under layer 130, an anti-ferromagnetic layer 135, a pinned layer 134', a nonmagnetic conductive layer 133, a soft magnetic layer 131b that constitutes a part of a free layer 131, a soft magnetic layer 131a that constitutes a part of the free layer 131, a mutual diffusion layer 132 inserted in the middle of the soft magnetic layer 131a, a nonmagnetic conductive layer or spin filter layer 137 and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

In this embodiment, the nonmagnetic conductive layer or spin filter layer 137 is formed on the free layer 131. Another constitutions, operations and advantages in this twelfth embodiment are the same as those of the eleventh embodiment except for differences in layer thickness and therefore a MR resistance change ΔRs substantially above 2.5 Ω can be obtained. In FIG. 16, the same reference numerals are used for the same elements as those in FIG. 15, respectively.

Table 9 indicates measured MR resistance change ΔRs of various samples of SVMR sensor in this embodiment.

To obtain each sample, NiCr (5 nm)/PtMn (13 nm)/CoFe (1.5 nm)/Ru (0.8 nm)/CoFe (2 nm)/Cu (2 nm)/a free layer with an inserted mutual diffusion layer/Ru (0.6 nm)/Ta (3 nm) were sequentially deposited on a substrate of AlTiC with an alumina film, and then the deposited layers were annealed by holding a temperature of 260° C. for five hours under applying a magnetic field of 300 mT (3 kG). The applied magnetic field during the measurement was 72,000 A/m (900 Oe).

TABLE 9

| Free layer with inserted mutual diffusion layer | ΔRs |
|---|---|
| CoFe(1 nm)/NiFe(3 nm) (comparison example) | 2.28 |
| CoFe(1 nm)/NiFe(1.5 nm)/Ta(0.2 nm)/NiFe(1.5 nm) | 2.80 |

Thirteenth Embodiment

Figure 17:
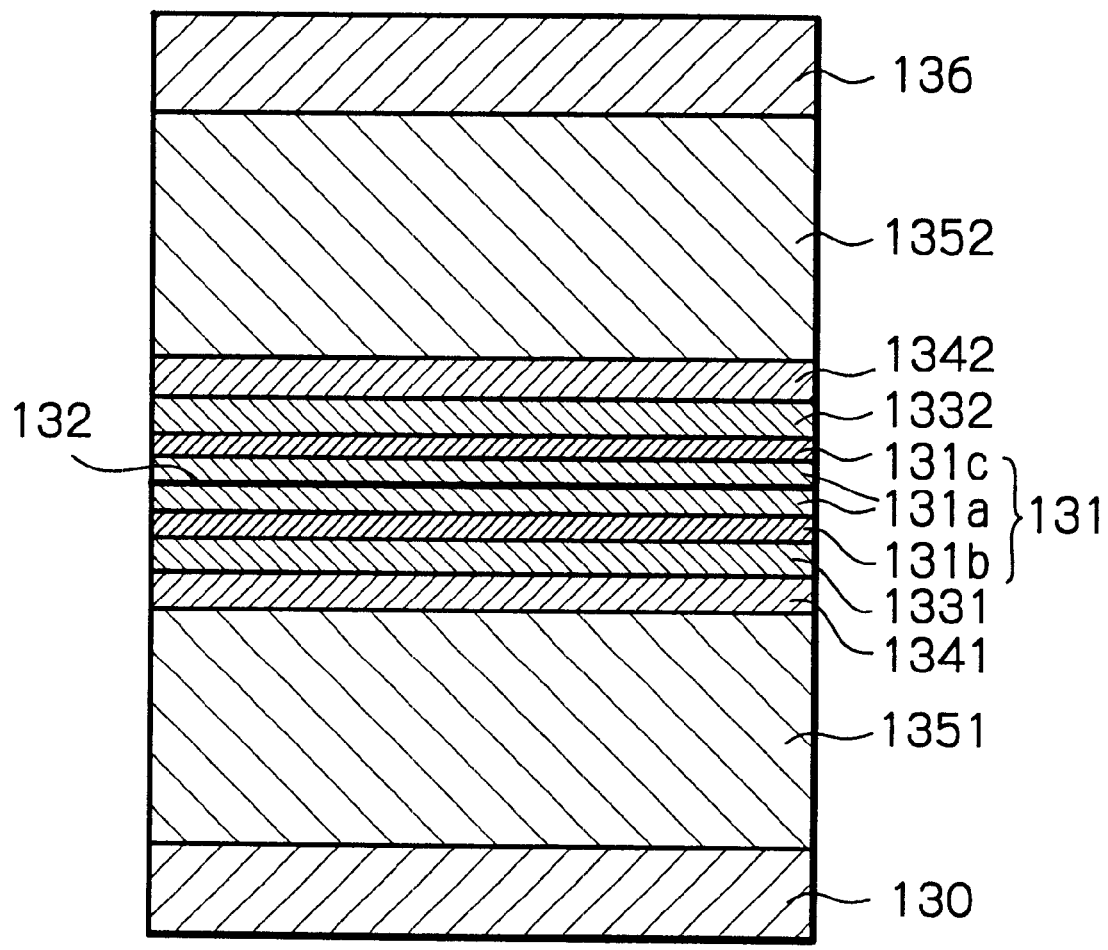
FIG. 17 shows a sectional view seen from an ABS illustrating a layer configuration of a SVMR multi-layered structure in a thirteenth embodiment according to the present invention.

FIG. 17 illustrates a layer configuration of a SVMR multi-layered structure in a thirteenth embodiment according to the present invention.

In this thirteenth embodiment, the SVMR multi-layered structure has a structure formed by sequentially layering an under layer 130, a first anti-ferromagnetic layer 1351, a first pinned layer 1341, a first nonmagnetic conductive layer 1331, a soft magnetic layer 131b that constitutes a part of a free layer 131, a soft magnetic layer 131a that constitutes a part of the free layer 131, a mutual diffusion layer 132 inserted in the middle of the soft magnetic layer 131a, a soft magnetic layer 131c that constitutes a part of the free layer 131, a second nonmagnetic conductive layer 1332, a second pinned layer 1342, a second anti-ferromagnetic layer 1352 and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

In this embodiment, the first and second anti-ferromagnetic layers are formed at both side of the free layer to provide a dual SVMR multi-layered structure. Another constitutions, operations and advantages in this thirteenth embodiment are substantially the same as those of the first embodiment and therefore a MR resistance change ΔRs substantially above 2.5 Ω can be obtained. In FIG. 17, the same reference numerals are used for the same elements as those in FIG. 2, respectively.

Table 10 indicates measured MR resistance change ΔRs of various samples of SVMR sensor in this embodiment.

To obtain each sample, NiCr (5 nm)/PtMn (13 nm)/CoFe (2 nm)/Cu (2 nm)/a free layer with an inserted mutual diffusion layer/Cu (2 nm)/CoFe (2 nm)/PtMn (13 nm)/Ta (3 nm) were sequentially deposited on a substrate of AlTiC with an alumina film, and then the deposited layers were annealed by holding a temperature of 260° C. for five hours under applying a magnetic field of 300 mT (3 kG). The applied magnetic field during the measurement was 72,000 A/m (900 Oe).

TABLE 10

| Free layer with inserted mutual diffusion layer | ΔRs |
|---|---|
| CoFe(1 nm)/NiFe(3 nm)/CoFe(1 nm) (comparison example) | 2.42 |
| CoFe(1 nm)/NiFe(1.5 nm)/Ta(0.2 nm)/NiFe(1.5 nm)/CoFe(1 nm) | 2.95 |

Fourteenth Embodiment

Figure 18:
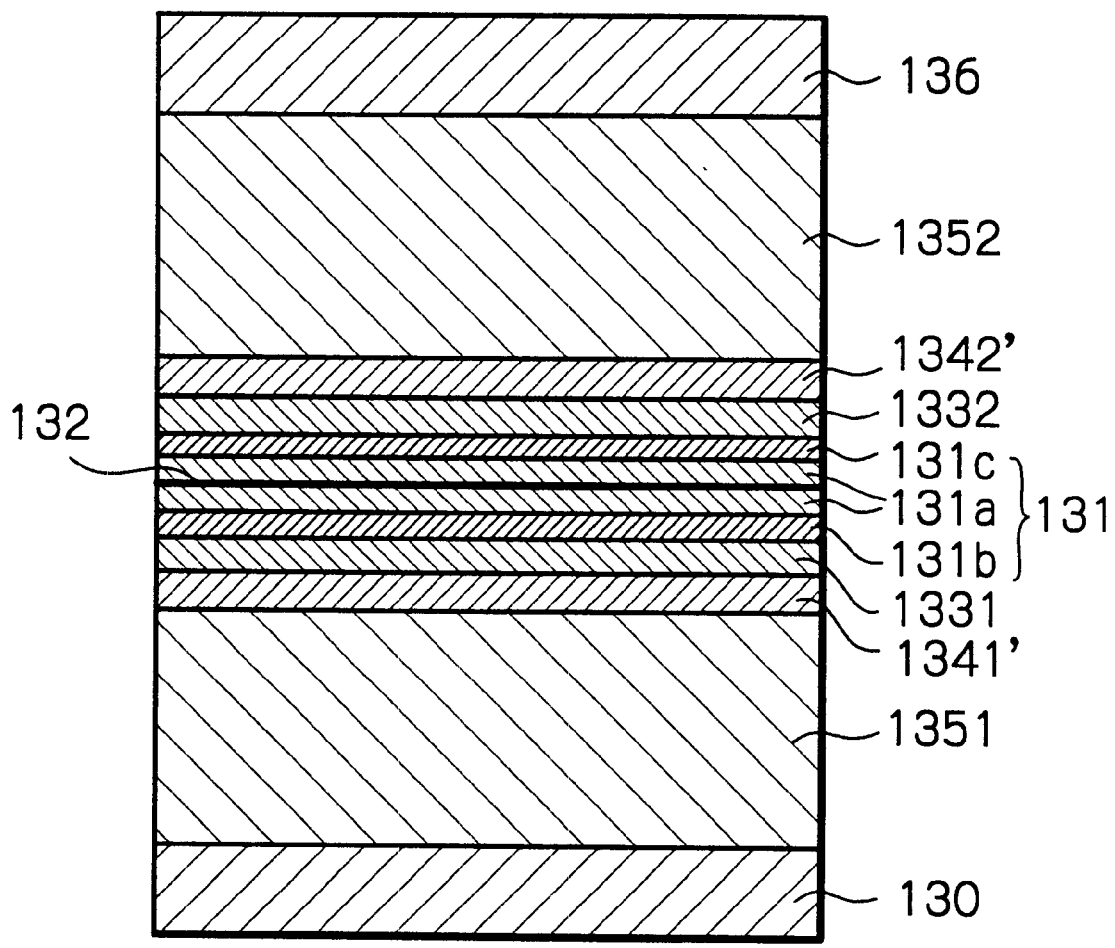
FIG. 18 shows a sectional view seen from an ABS illustrating a layer configuration of a SVMR multi-layered structure in a fourteenth embodiment according to the present invention.

FIG. 18 illustrates a layer configuration of a SVMR multi-layered structure in a fourteenth embodiment according to the present invention.

In this fourteenth embodiment, the SVMR multi-layered structure has a structure formed by sequentially layering an under layer 130, a first anti-ferromagnetic layer 1351, a first pinned layer 1341', a first nonmagnetic conductive layer 1331, a soft magnetic layer 131b that constitutes a part of a free layer 131, a soft magnetic layer 131a that constitutes a part of the free layer 131, a mutual diffusion layer 132 inserted in the middle of the soft magnetic layer 131a, a soft magnetic layer 131c that constitutes a part of the free layer 131, a second nonmagnetic conductive layer 1332, a second pinned layer 1342', a second anti-ferromagnetic layer 1352 and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

Each of the first and second pinned layers 1341' and 1342' is not a single layer structure but a multi-layered structure with two ferromagnetic layers such as for example CoFe films and a nonmagnetic layer such as for example a Ru film inserted between the two ferromagnetic layers (synthetic structure).

In this embodiment, the structure of the pinned layers 1341' and 1342' is modified from that of the pinned layers 1341 and 1342 in the thirteenth embodiment. Another constitutions, operations and advantages in this fourteenth embodiment are substantially the same as those of the thirteenth embodiment and therefore a MR resistance change ΔRs substantially above 2.5 Ω can be obtained. In FIG. 18, the same reference numerals are used for the same elements as those in FIG. 17, respectively.

Table 11 indicates measured MR resistance change ΔRs of various samples of SVMR sensor in this embodiment.

To obtain each sample, NiCr (5 nm)/PtMn (13 nm)/CoFe (1.5 nm)/Ru (0.8 nm)/CoFe (2 nm)/Cu (2 nm)/a free layer with an inserted mutual diffusion layer/Cu (2 nm)/CoFe (2 nm)/Ru (0.8 nm)/CoFe (1.5 nm)/PtMn (13 nm)/Ta (3 nm) were sequentially deposited on a substrate of AlTiC with an alumina film, and then the deposited layers were annealed by holding a temperature of 260° C. for five hours under applying a magnetic field of 300 mT (3 kG). The applied magnetic field during the measurement was 72,000 A/m (900 Oe).

TABLE 11

| Free layer with inserted mutual diffusion layer | ΔRs |
|---|---|
| CoFe (1 nm)/NiFe(3 nm)/CoFe(1 nm)(comparison example) | 2.28 |
| CoFe(1 nm)/NiFe(1.5 nm)/Ta(0.2 nm)/NiFe(1.5 nm)/CoFe (1 nm) | 2.80 |

Fifteenth Embodiment

Figure 19:
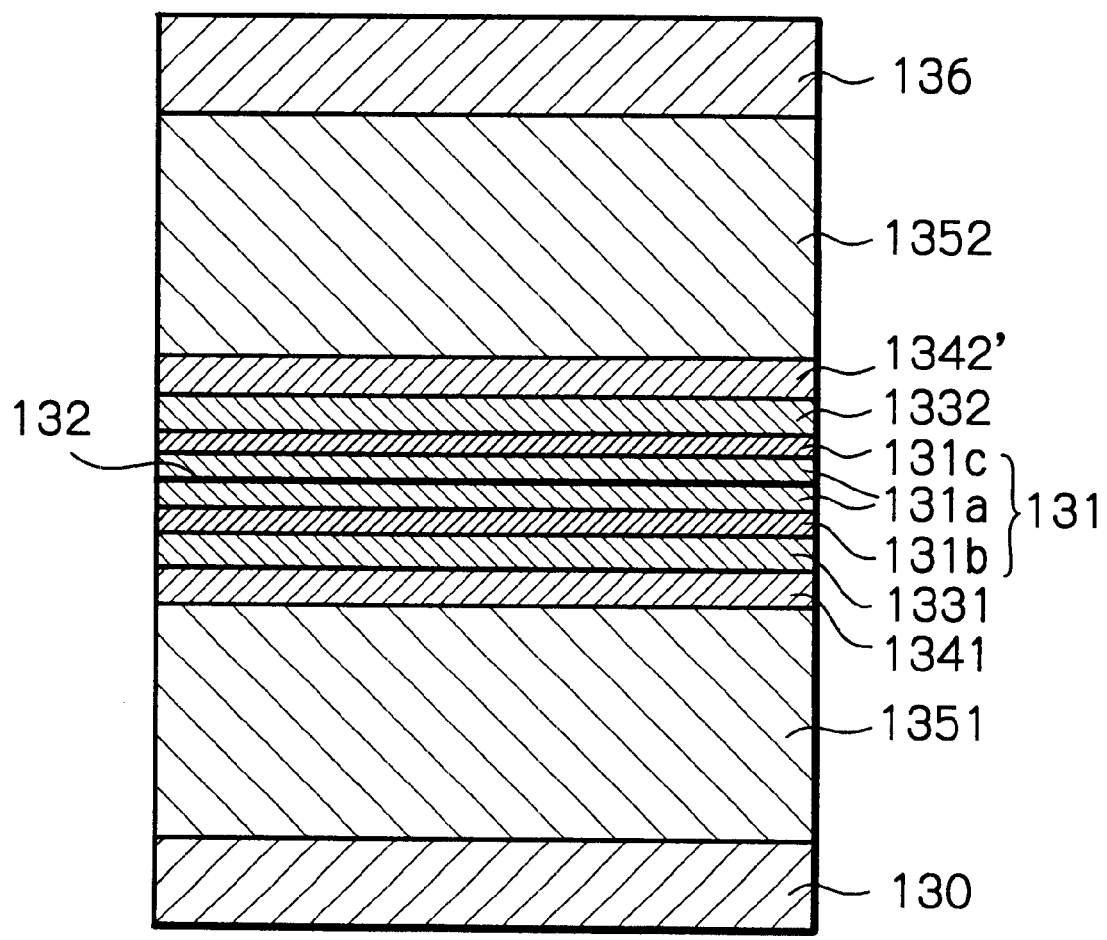
FIG. 19 shows a sectional view seen from an ABS illustrating a layer configuration of a SVMR multi-layered structure in a fifteenth embodiment according to the present invention.

FIG. 19 illustrates a layer configuration of a SVMR multi-layered structure in a fifteenth embodiment according to the present invention.

In this fifteenth embodiment, the SVMR multi-layered structure has a structure formed by sequentially layering an under layer 130, a first anti-ferromagnetic layer 1351, a first pinned layer 1341, a first nonmagnetic conductive layer 1331, a soft magnetic layer 131b that constitutes a part of a free layer 131, a soft magnetic layer 131a that constitutes a part of the free layer 131, a mutual diffusion layer 132 inserted in the middle of the soft magnetic layer 131a, a soft magnetic layer 131c that constitutes a part of the free layer 131, a second nonmagnetic conductive layer 1332, a second pinned layer 1342', a second anti-ferromagnetic layer 1352 and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

The second pinned layer 1342' is not a single layer structure but a multi-layered structure with two ferromagnetic layers such as for example CoFe films and a nonmagnetic layer such as for example a Ru film inserted between the two ferromagnetic layers (synthetic structure).

In this embodiment, the structure of the second pinned layer 1342' is modified from that of the pinned layer 1342 in the thirteenth embodiment. Another constitutions, operations and advantages in this fifteenth embodiment are substantially the same as those of the thirteenth embodiment and therefore a MR resistance change ΔRs substantially above 2.5 Ω can be obtained. In FIG. 19, the same reference numerals are used for the same elements as those in FIG. 17, respectively.

Table 12 indicates measured MR resistance change ΔRs of various samples of SVMR sensor in this embodiment.

To obtain each sample, NiCr (5 nm)/PtMn (13 nm)/CoFe (2 nm)/Cu (2 nm)/a free layer with an inserted mutual diffusion layer/Cu (2 nm)/CoFe (2 nm)/Ru (0.8 nm)/CoFe (1.5 nm)/PtMn (13 nm)/Ta (3 nm) were sequentially deposited on a substrate of AlTiC with an alumina film, and then the deposited layers were annealed by holding a temperature of 260° C. for five hours under applying a magnetic field of 300 mT (3 kG). The applied magnetic field during the measurement was 72,000 A/m (900 Oe).

TABLE 12

| Free layer with inserted mutual diffusion layer | ΔRs |
|---|---|
| CoFe(1 nm)/NiFe(3 nm)/CoFe(1 nm)(comparison example) | 2.37 |
| CoFe(1 nm)/NiFe(1.5 nm)/Ta(0.2 nm)/NiFe(1.5 nm)/CoFe (1 nm) | 2.89 |

Sixteenth Embodiment

Figure 20:
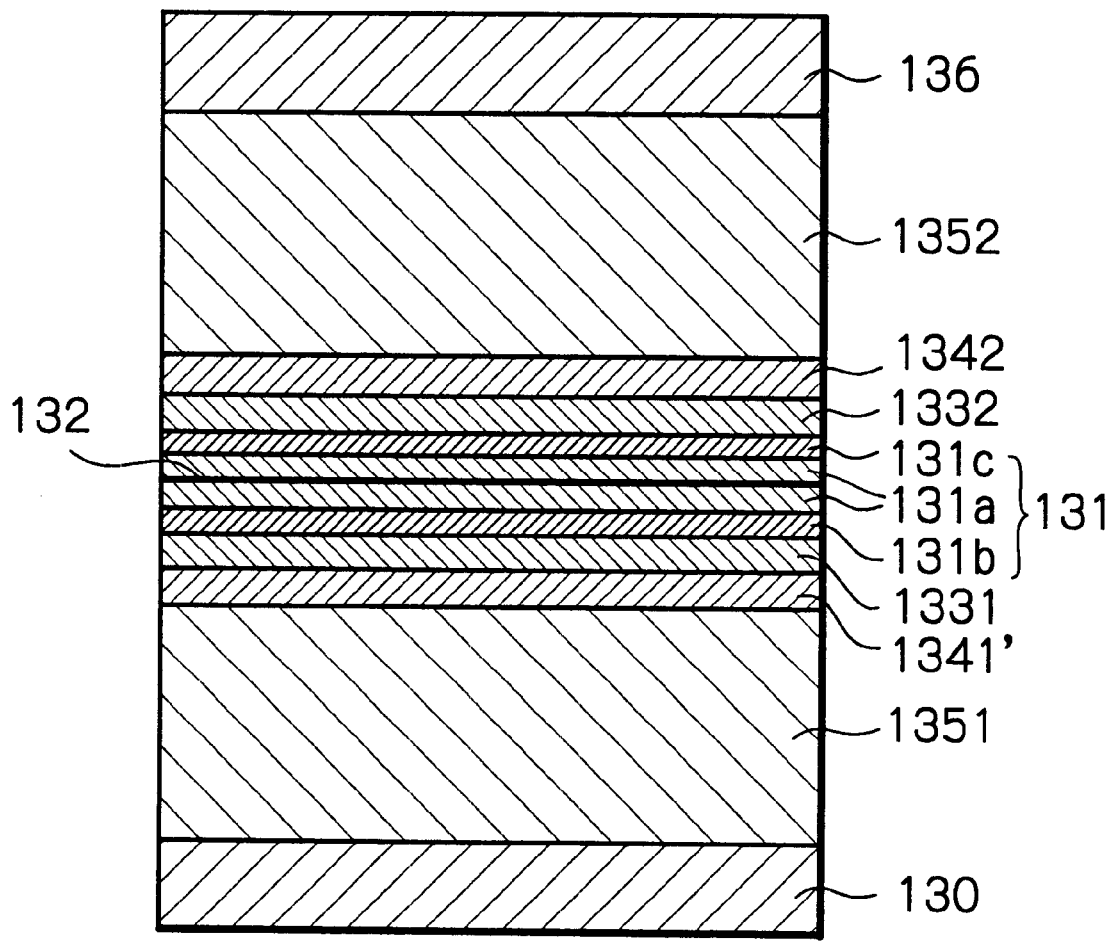
FIG. 20 shows a sectional view seen from an ABS illustrating a layer configuration of a SVMR multi-layered structure in a sixteenth embodiment according to the present invention.

FIG. 20 illustrates a layer configuration of a SVMR multi-layered structure in a sixteenth embodiment according to the present invention.

In this sixteenth embodiment, the SVMR multi-layered structure has a structure formed by sequentially layering an under layer 130, a first anti-ferromagnetic layer 1351, a first pinned layer 1341', a first nonmagnetic conductive layer 1331, a soft magnetic layer 131b that constitutes a part of a free layer 131, a soft magnetic layer 131a that constitutes a part of the free layer 131, a mutual diffusion layer 132 inserted in the middle of the soft magnetic layer 131a, a soft magnetic layer 131c that constitutes a part of the free layer 131, a second nonmagnetic conductive layer 1332, a second pinned layer 1342, a second anti-ferromagnetic layer 1352 and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

The first pinned layer 1341' is not a single layer structure but a multi-layered structure with two ferromagnetic layers such as for example CoFe films and a nonmagnetic layer such as for example a Ru film inserted between the two ferromagnetic layers (synthetic structure).

In this embodiment, the structure of the first pinned layer 1341' is modified from that of the pinned layer 1341 in the thirteenth embodiment. Another constitutions, operations and advantages in this sixteenth embodiment are substantially the same as those of the thirteenth embodiment and therefore a MR resistance change ΔRs substantially above 2.5 Ω can be obtained. In FIG. 20, the same reference numerals are used for the same elements as those in FIG. 17, respectively.

Table 13 indicates measured MR resistance change ΔRs of various samples of SVMR sensor in this embodiment.

To obtain each sample, NiCr (5 nm)/PtMn (13 nm)/CoFe (1.5 nm)/Ru (0.8 nm)/CoFe (2 nm)/Cu (2 nm)/a free layer with an inserted mutual diffusion layer/Cu (2 nm)/CoFe (2 nm)/PtMn (13 nm)/Ta (3 nm) were sequentially deposited on a substrate of AlTiC with an alumina film, and then the deposited layers were annealed by holding a temperature of 260° C. for five hours under applying a magnetic field of 300 mT (3 kG). The applied magnetic field during the measurement was 72,000 A/m (900 Oe).

TABLE 13

| Free layer with inserted mutual diffusion layer | ΔRs |
|---|---|
| CoFe(1 nm)/NiFe(3 nm)/CoFe(1 nm) (comparison example) | 2.39 |
| CoFe(1 nm)/NiFe(1.5 nm)/Ta(0.2 nm)/NiFe(1.5 nm)ICoFe (1 nm) | 2.93 |

Seventeenth Embodiment

Figure 21:
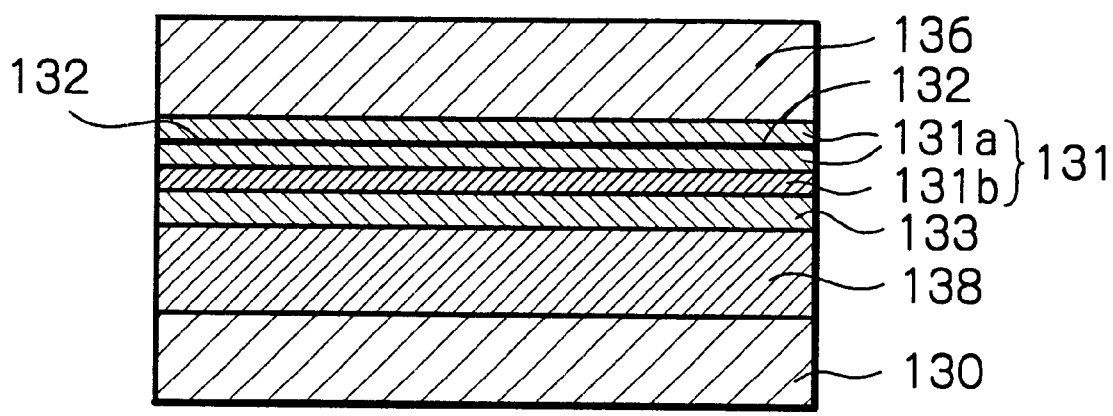
FIG. 21 shows a sectional view seen from an ABS illustrating a layer configuration of a SVMR multi-layered structure in a seventeenth embodiment according to the present invention.

FIG. 21 illustrates a layer configuration of a SVMR multi-layered structure in a seventeenth embodiment according to the present invention.

In this seventeenth embodiment, the SVMR multi-layered structure has a structure formed by sequentially layering an under layer 130, a self-pinned layer 138, a nonmagnetic conductive layer 133, a soft magnetic layer 131b that constitutes a part of a free layer 131, a soft magnetic layer 131a that constitutes a part of the free layer 131, a mutual diffusion layer 132 inserted in the middle of the soft magnetic layer 131a and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

The self-pinned layer 138 is a multi-layered structure with at least two ferromagnetic layers such as for example CoFe films and a nonmagnetic layer such as for example a Ru film inserted between the at least two ferromagnetic layers. The two ferromagnetic layers are anti-ferromagnetically coupled with each other to have magnetic moments oriented in opposite directions.

In this embodiment, since the self-pinned layer for automatically pinning its magnetization is used, no anti-ferromagnetic layer for pinning by exchange coupling the pinned layer is needed. Another constitutions, operations and advantages in this seventeenth embodiment are the same as those of the first embodiment. In FIG. 21, the same reference numerals are used for the same elements as those in FIG. 2, respectively.

The SVMR sensor in this embodiment has a multi-layered structure formed by sequentially depositing NiCr (5 nm)/CoFe (3 nm)/Ru (0.8 nm)/CoFe (2 nm)/Cu (2 nm)/a free layer with an inserted mutual diffusion layer/Ta (5 nm) on a substrate of AlTiC with an alumina film. The free layer with the inserted mutual diffusion layer has a multi-layered structure formed by sequentially depositing CoFe(1 nm)/NiFe (1.5 nm)/Ta (0.2 nm)/NiFe (1.5 nm)/CoFe (1 nm).

Eighteenth Embodiment

Figure 22:
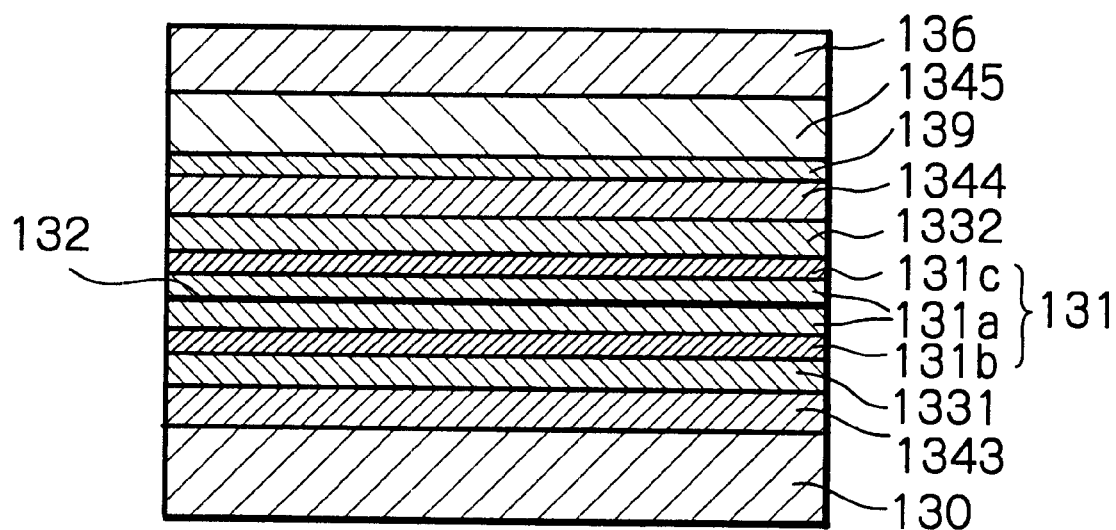
FIG. 22 shows a sectional view seen from an ABS illustrating a layer configuration of a SVMR multi-layered structure in an eighteenth embodiment according to the present invention.

FIG. 22 illustrates a layer configuration of a SVMR multi-layered structure in an eighteenth embodiment according to the present invention.

In this eighteenth embodiment, the SVMR multi-layered structure has a structure formed by sequentially layering an under layer 130, a first pinned layer 1343, a first nonmagnetic conductive layer 1331, a soft magnetic layer 131b that constitutes a part of a free layer 131, a soft magnetic layer 131a that constitutes a part of the free layer 131, a mutual diffusion layer 132 inserted in the middle of the soft magnetic layer 131a, a soft magnetic layer 131c that constitutes a part of the free layer 131, a second nonmagnetic conductive layer 1332, a second pinned layer 1344, an anti-parallel coupling layer 139, a third pinned layer 1345 and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

The second and third pinned layers 1344 and 1345 are coupled with the anti-parallel coupling layer 139 constituted by for example a Ru film so that their magnetization directions become anti-parallel, and these magnetizations of the second and third pinned layers 1344 and 1345 and the magnetization of the first pinned layer 1343 are fixed by a current bias magnetic field due to the sense current of the MR sensor. The third pinned layer 1345 has a two-layers structure of a CoFe film and a high resistivity material film such as a CoNbZr film.

In this embodiment, since the pinned layer is constituted by a plurality of ferromagnetic layers whose magnetizations are fixed by a magnetic filed due to the current flowing through the MR sensor, no anti-ferromagnetic layer for pinning by exchange coupling the pinned layer is needed. Another constitutions, operations and advantages in this eighteenth embodiment are the same as those of the first embodiment. In FIG. 22, the same reference numerals are used for the same elements as those in FIG. 2, respectively.

The SVMR sensor in this embodiment has a multi-layered structure formed by sequentially depositing NiCr (5 nm)/CoFe (2 nm)/Cu (2 nm)/a free layer with an inserted mutual diffusion layer/Cu (2 nm)/CoFe (2 nm)/Ru (0.8 nm)/CoFe (0.5 nm)/CoNbZr (4 nm)/Ta (3 nm) on a substrate of AlTiC with an alumina film. The free layer with the inserted mutual diffusion layer has a multi-layered structure formed by sequentially depositing CoFe (1 nm)/NiFe (1.5 nm)/Ta (0.2 nm)/NiFe (1.5 nm)/CoFe (1 nm).

Nineteenth Embodiment

Figure 23:
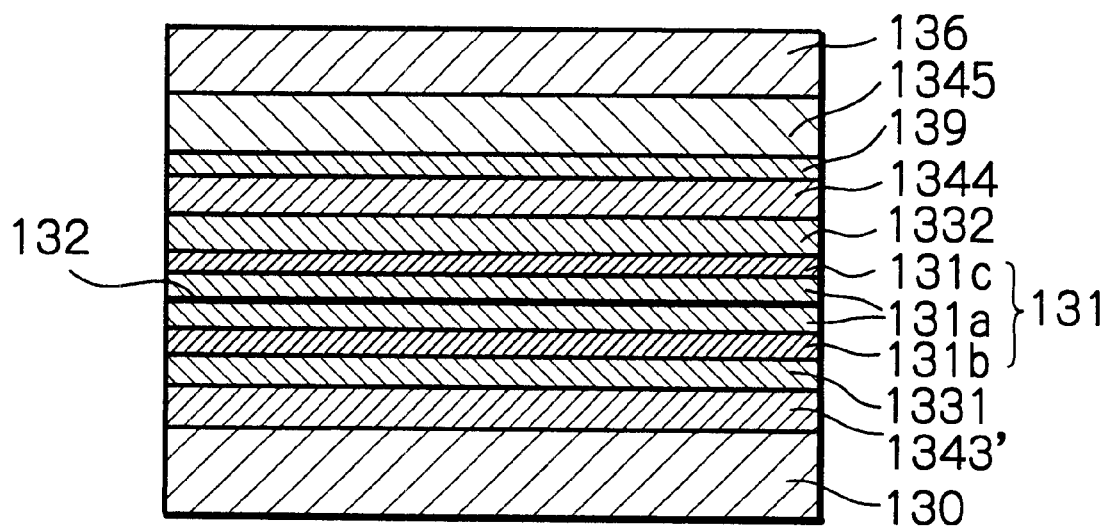
FIG. 23 shows a sectional view seen from an ABS illustrating a layer configuration of a SVMR multi-layered structure in a nineteenth embodiment according to the present invention.

FIG. 23 illustrates a layer configuration of a SVMR multi-layered structure in a nineteenth embodiment according to the present invention.

In this nineteenth embodiment, the SVMR multi-layered structure has a structure formed by sequentially layering an under layer 130, a first pinned layer 1343', a first nonmagnetic conductive layer 1331, a soft magnetic layer 131b that constitutes a part of a free layer 131, a soft magnetic layer 131a that constitutes a part of the free layer 131, a mutual diffusion layer 132 inserted in the middle of the soft magnetic layer 131a, a soft magnetic layer 131c that constitutes a part of the free layer 131, a second nonmagnetic conductive layer 1332, a second pinned layer 1344, an anti-parallel coupling layer 139, a third pinned layer 1345 and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

The first pinned layer 1343' is not a single layer structure but a multi-layered structure with two ferromagnetic layers such as for example CoFe films and a nonmagnetic layer such as for example a Ru film inserted between the two ferromagnetic layers (synthetic structure). The second and third pinned layers 1344 and 1345 are coupled with the anti-parallel coupling layer 139 constituted by for example a Ru film so that their magnetization directions become anti-parallel, and these magnetizations of the second and third pinned layers 1344 and 1345 and the magnetization of the first pinned layer 1343' are fixed by a current bias magnetic field due to the sense current of the MR sensor. The third pinned layer 1345 has a two-layers structure of a CoFe film and a high resistivity material film such as a CoNbZr film.

In this embodiment, the structure of the first pinned layer 1343' is modified from that of the pinned layer 1343 in the eighteenth embodiment. Another constitutions, operations and advantages in this nineteenth embodiment are the same as those of the eighteenth embodiment. In FIG. 23, the same reference numerals are used for the same elements as those in FIG. 22, respectively.

The SVMR sensor in this embodiment has a multi-layered structure formed by sequentially depositing NiCr (5 nm)/ CoFe (1 nm)/Ru (0.8 nm)/CoFe (2 nm)/Cu (2 nm)/a free layer with an inserted mutual diffusion layer/Cu (2 nm)/ CoFe (2 nm)/Ru (0.8 nm)/CoFe (0.5 nm)/CoNbZr (4 nm)/Ta (3 nm) on a substrate of AlTiC with an alumina film. The free layer with the inserted mutual diffusion layer has a multi-layered structure formed by sequentially depositing CoFe (1 nm)/NiFe (1.5 nm)/Ta (0.2 nm)/NiFe (1.5 nm)/ CoFe (1 nm).

Twentieth Embodiment

Figure 24:
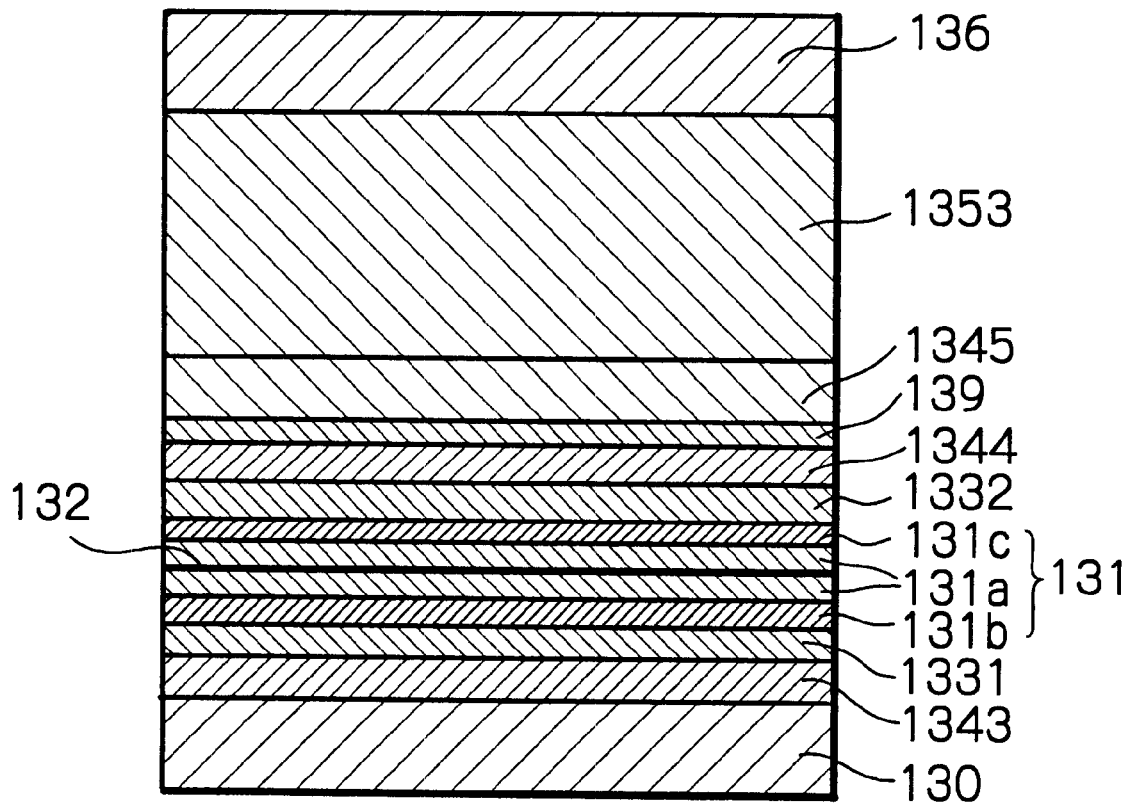
FIG. 24 shows a sectional view seen from an ABS illustrating a layer configuration of a SVMR multi-layered structure in a twentieth embodiment according to the present invention.

FIG. 24 illustrates a layer configuration of a SVMR multi-layered structure in a twentieth embodiment according to the present invention.

In this twentieth embodiment, the SVMR multi-layered structure has a structure formed by sequentially layering an under layer 130, a first pinned layer 1343, a first nonmagnetic conductive layer 1331, a soft magnetic layer 131b that constitutes a part of a free layer 131, a soft magnetic layer 131a that constitutes a part of the free layer 131, a mutual diffusion layer 132 inserted in the middle of the soft magnetic layer 131a, a soft magnetic layer 131c that constitutes a part of the free layer 131, a second nonmagnetic conductive layer 1332, a second pinned layer 1344, an anti-parallel coupling layer 139, a third pinned layer 1345, an anti-ferromagnetic layer 1353 and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

In this embodiment, the anti-ferromagnetic layer 1353 is formed on the third pinned layer 1345 so as to fix the magnetization of this pinned layer 1345 by exchange coupling. Another constitutions, operations and advantages in this twentieth embodiment are the same as those of the eighteenth embodiment. In FIG. 24, the same reference numerals are used for the same elements as those in FIG. 22, respectively.

The SVMR sensor in this embodiment has a multi-layered structure formed by sequentially depositing NiCr (5 nm)/ CoFe (2 nm)/Cu (2 nm)/a free layer with an inserted mutual diffusion layer/Cu (2 nm)/CoFe (2 nm)/Ru (0.8 nm)/CoFe (0.5 nm)/CoNbZr (4 nm)/PtMn (15 nm)/Ta (3 nm) on a substrate of AlTiC with an alumina film. The free layer with the inserted mutual diffusion layer has a multi-layered structure formed by sequentially depositing CoFe (1 nm)/ NiFe (1.5 nm)/Ta (0.2 nm)/NiFe (1.5 nm)/CoFe (1 nm).

Twenty-First Embodiment

Figure 25:
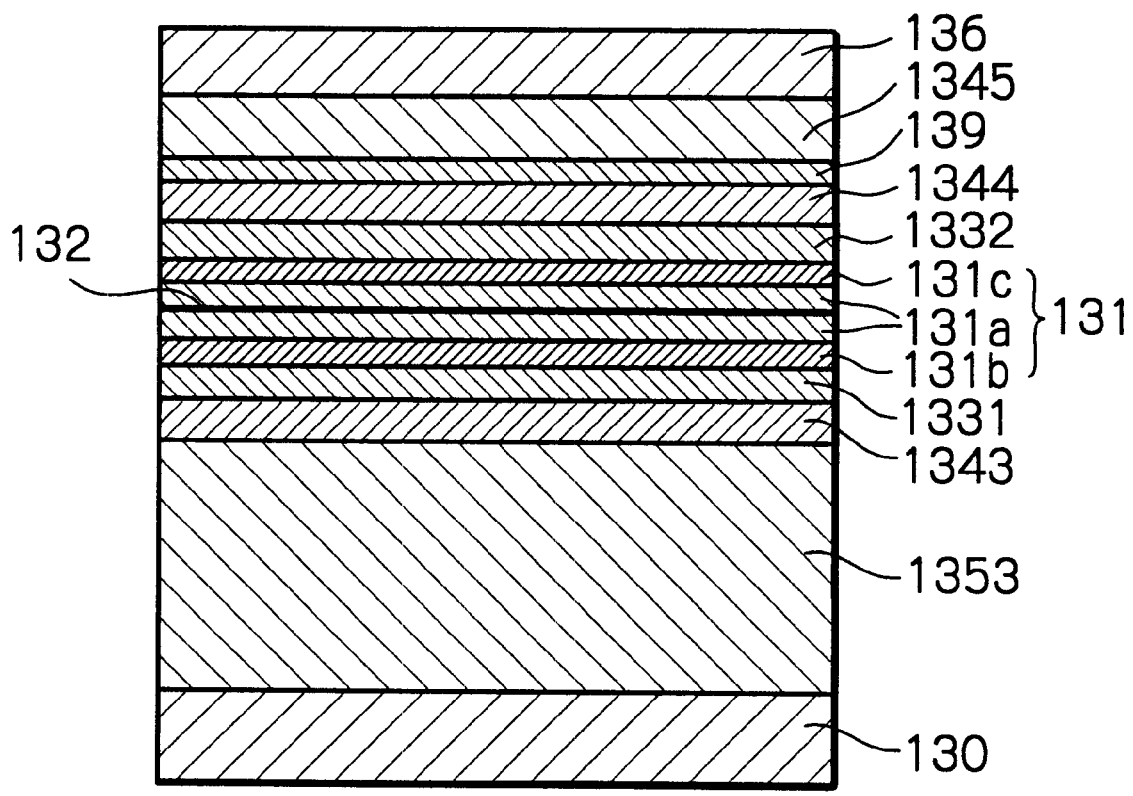
FIG. 25 shows a sectional view seen from an ABS illustrating a layer configuration of a SVMR multi-layered structure in a twenty-first embodiment according to the present invention.

FIG. 25 illustrates a layer configuration of a SVMR multi-layered structure in a twenty-first embodiment according to the present invention.

In this twenty-first embodiment, the SVMR multi-layered structure has a structure formed by sequentially layering an under layer 130, an anti-ferromagnetic layer 1353, a first pinned layer 1343, a first nonmagnetic conductive layer 1331, a soft magnetic layer 131b that constitutes a part of a free layer 131, a soft magnetic layer 131a that constitutes a part of the free layer 131, a mutual diffusion layer 132 inserted in the middle of the soft magnetic layer 131a, a soft magnetic layer 131c that constitutes a part of the free layer 131, a second nonmagnetic conductive layer 1332, a second pinned layer 1344, an anti-parallel coupling layer 139, a third pinned layer 1345 and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

In this embodiment, the anti-ferromagnetic layer 1353 is formed under the first pinned layer 1343 so as to fix the magnetization of this pinned layer 1343 by exchange coupling. Another constitutions, operations and advantages in this twenty-first embodiment are the same as those of the eighteenth embodiment. In FIG. 25, the same reference numerals are used for the same elements as those in FIG. 22, respectively.

The SVMR sensor in this embodiment has a multi-layered structure formed by sequentially depositing NiCr (5 nm)/ PtMn (15 nm)/CoFe (2 nm)/Cu (2 nm)/a free layer with an inserted mutual diffusion layer/Cu (2 nm)/CoFe (2 nm)/Ru (0.8 nm)/CoFe (0.5 nm)/CoNbZr (4 nm)/Ta (3 nm) on a substrate of AlTiC with an alumina film. The free layer with the inserted mutual diffusion layer has a multi-layered structure formed by sequentially depositing CoFe (1 nm)/ NiFe (1.5 nm)/Ta (0.2 nm)/NiFe (1.5 nm)/CoFe (1 nm).

Twenty-Second Embodiment

Figure 26:
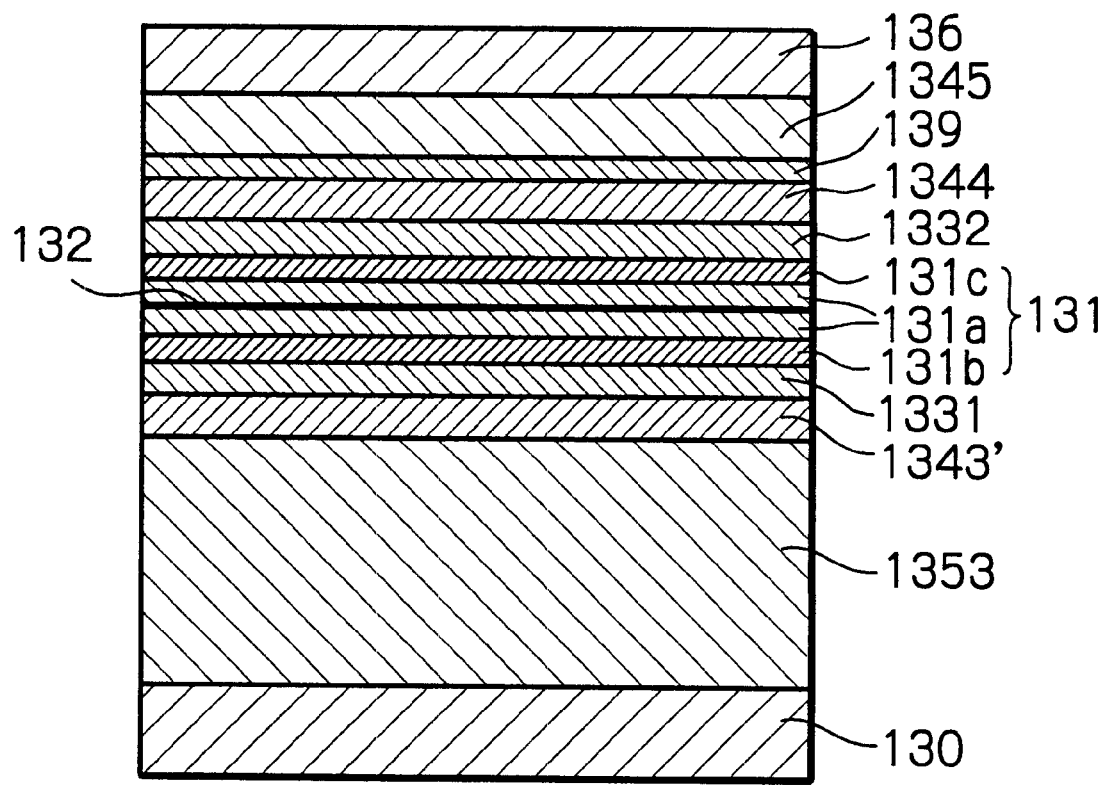
FIG. 26 shows a sectional view seen from an ABS illustrating a layer configuration of a SVMR multi-layered structure in a twenty-second embodiment according to the present invention.

FIG. 26 illustrates a layer configuration of a SVMR multi-layered structure in a twenty-second embodiment according to the present invention.

In this twenty-second embodiment, the SVMR multi-layered structure has a structure formed by sequentially layering an under layer 130, an anti-ferromagnetic layer 1353, a first pinned layer 1343', a first nonmagnetic conductive layer 1331, a soft magnetic layer 131b that constitutes a part of a free layer 131, a soft magnetic layer 131a that constitutes a part of the free layer 131, a mutual diffusion layer 132 inserted in the middle of the soft magnetic layer 131a, a soft magnetic layer 131c that constitutes a part of the free layer 131, a second nonmagnetic conductive layer 1332, a second pinned layer 1344, an anti-parallel coupling layer 139, a third pinned layer 1345 and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

The first pinned layer 1343' is not a single layer structure but a multi-layered structure with two ferromagnetic layers such as for example CoFe films and a nonmagnetic layer such as for example a Ru film inserted between the two ferromagnetic layers (synthetic structure).

In this embodiment, the anti-ferromagnetic layer 1353 is formed under the first pinned layer 1343' that has the same structure as the synthetic structure pinned layer 1343' shown in the nineteenth embodiment so as to fix the magnetization of this pinned layer 1343' by exchange coupling. Another constitutions, operations and advantages in this twenty-second embodiment are the same as those of the nineteenth embodiment. In FIG. 26, the same reference numerals are used for the same elements as those in FIG. 23, respectively.

The SVMR sensor in this embodiment has a multi-layered structure formed by sequentially depositing NiCr (5 nm)/ PtMn (15 nm)/CoFe (2 nm)/Ru (0.8 nm)/CoFe (2 nm)/Cu (2 nm)/a free layer with an inserted mutual diffusion layer/Cu (2 nm)/CoFe (2 nm)/Ru (0.8 nm)/CoFe (0.5 nm)/CoNbZr (4 nm)/Ta (3 nm) on a substrate of AlTiC with an alumina film. The free layer with the inserted mutual diffusion layer has a multi-layered structure formed by sequentially depositing CoFe (1 nm)/NiFe (1.5 nm)/Ta (0.2 nm)/NiFe (1.5 nm)/ CoFe (1 nm).

Twenty-Third Embodiment

Figure 27:
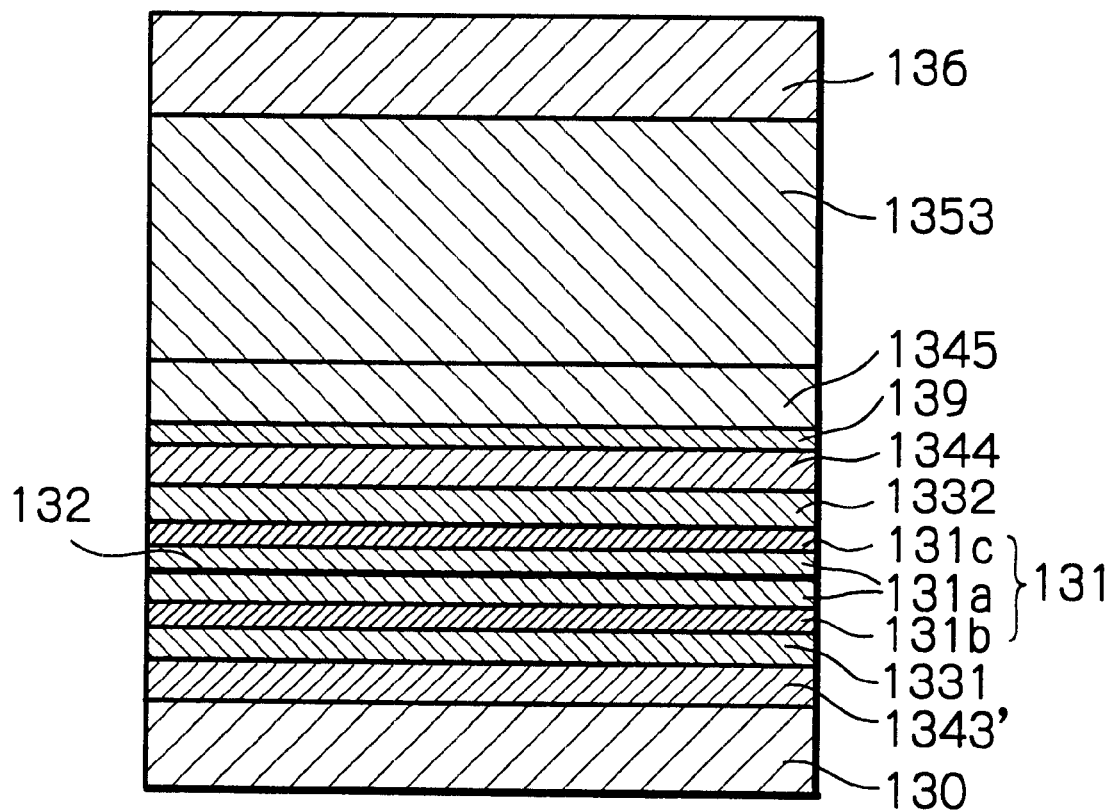
FIG. 27 shows a sectional view seen from an ABS illustrating a layer configuration of a SVMR multi-layered structure in a twenty-third embodiment according to the present invention.

FIG. 27 illustrates a layer configuration of a SVMR multi-layered structure in a twenty-third embodiment according to the present invention.

In this twenty-third embodiment, the SVMR multi-layered structure has a structure formed by sequentially layering an under layer 130, a first pinned layer 1343', a first nonmagnetic conductive layer 1331, a soft magnetic layer 131b that constitutes a part of a free layer 131, a soft magnetic layer 131a that constitutes a part of the free layer 131, a mutual diffusion layer 132 inserted in the middle of the soft magnetic layer 131a, a soft magnetic layer 131c that constitutes a part of the free layer 131, a second nonmagnetic conductive layer 1332, a second pinned layer 1344, an anti-parallel coupling layer 139, a third pinned layer 1345, an anti-ferromagnetic layer 1353 and a protection layer 136. It should be noted that, after annealing, a metallic composition of the mutual diffusion layer 132 is diffused in the soft magnetic layer 131a of the free layer 131 and metallic composition of the soft magnetic layer 131a is diffused in the mutual diffusion layer 132.

The first pinned layer 1343' is not a single layer structure but a multi-layered structure with two ferromagnetic layers such as for example CoFe films and a nonmagnetic layer such as for example a Ru film inserted between the two ferromagnetic layers (synthetic structure).

In this embodiment, the anti-ferromagnetic layer 1353 is formed on the third pinned layer 1345 in the nineteenth embodiment so as to fix the magnetization of this pinned layer 1345 by exchange coupling. Another constitutions, operations and advantages in this twenty-third embodiment are the same as those of the nineteenth embodiment. In FIG. 27, the same reference numerals are used for the same elements as those in FIG. 23, respectively.

The SVMR sensor in this embodiment has a multi-layered structure formed by sequentially depositing NiCr (5 nm)/ CoFe (1 nm)/Ru (0.8 nm)/CoFe (2 nm)/Cu (2 nm)/a free layer with an inserted mutual diffusion layer/Cu (2 nm)/ CoFe (2 nm)/Ru (0.8 nm)/CoFe (0.5 nm)/CoNbZr (4 nm)/ PtMn (15 nm)/Ta (3 nm) on a substrate of AlTiC with an alumina film. The free layer with the inserted mutual diffusion layer has a multi-layered structure formed by sequentially depositing CoFe (1 nm)/NiFe (1.5 nm)/Ta (0.2 nm)/ NiFe (1.5 nm)/CoFe (1 nm).

Although the above described embodiments concern the SVMR sensors, it is apparent that the present invention can be applied to another GMR sensor or a TMR sensor.

Many widely different embodiments of the present invention may be constructed without departing from the spirit and scope of the present invention. It should be understood that the present invention is not limited to the specific embodiments described in the specification, except as defined in the appended claims.

What is claimed is:

1. A magnetoresistive effect sensor comprising:
at least one pinned layer, a magnetization direction of said at least one pinned layer being fixed;
at least one nonmagnetic layer;
a free layer layered with said at least one pinned layer via said at least one nonmagnetic layer, a magnetization direction of said free layer being variable depending upon a magnetic field applied to said free layer; and
a mutual diffusion layer made of a nonmagnetic metal and provided with a thickness of 0.1 to 0.5 nm, a metallic composition of said free layer being diffused in said mutual diffusion layer,
a nonmagnetic metal being diffused in at least part of said free layer.

2. The sensor as claimed in claim 1, wherein said mutual diffusion layer is inserted in the middle of said free layer.

3. The sensor as claimed in claim 1, wherein said mutual diffusion layer is layered on one face of said free layer, the other face of said free layer being in contact with said at least one nonmagnetic layer.

4. The sensor as claimed in claim 1, wherein said nonmagnetic metal contains at least one component selected from a group of Al, Si, Ti, V, Cr, Mn, Ga, Ge, Y, Zr, Nb, Mo, Ru, Rh, Pd, In, Sn, Hf, Ta, W, Re, Os, Ir and Pt.

5. The sensor as claimed in claim 1, wherein said sensor further comprises at least one anti-ferromagnetic layer for fixing the magnetization direction of said at least one pinned layer using a bias magnetic field due to exchange coupling, said at least one anti-ferromagnetic layer being layered to contact with said at least one pinned layer.

6. The sensor as claimed in claim 5, wherein said at least one pinned layer has a single layer structure including a ferromagnetic layer.

7. The sensor as claimed in claim 5, wherein said at least one pinned layer has a multi-layered structure including ferromagnetic layers.

8. The sensor as claimed in claim 5, wherein said at least one pinned layer has a multi-layered structure including ferromagnetic layers and a nonmagnetic layer.

9. The sensor as claimed in claim 1, wherein said at least one pinned layer has a multi-layered structure including at least two ferromagnetic layers that are anti-ferromagnetically coupled with each other to have magnetic moments in opposite directions.

10. The sensor as claimed in claim 1, wherein said at least one pinned layer is at least one ferromagnetic layer, a magnetization of said at least one ferromagnetic layer being fixed by a magnetic field produced due to a current flowing through said sensor.

11. The sensor as claimed in claim 1, wherein said at least one nonmagnetic layer consists of one nonmagnetic layer and said at least one pinned layer consists of one pinned layer, and wherein said sensor has a multi-layered structure of an under layer, said free layer, said one nonmagnetic layer and said one pinned layer sequentially layered in this order from a substrate side.

12. The sensor as claimed in claim 11, wherein said under layer is oriented in (1,1,1) plane.

13. The sensor as claimed in claim 12, wherein said sensor further comprises a protection layer being oriented in (1,1,1) plane.

14. The sensor as claimed in claim 11, wherein said sensor further comprises a protection layer being oriented in (1,1,1) plane.

15. The sensor as claimed in claim 1, wherein said at least one nonmagnetic layer consists of one nonmagnetic layer and said at least one pinned layer consists of one pinned layer, and wherein said sensor has a multi-layered structure of an under layer, said one pinned layer, said one nonmagnetic layer and said free layer sequentially layered in this order from a substrate side.

16. The sensor as claimed in claim 15, wherein said under layer is oriented in (1,1,1) plane.

17. The sensor as claimed in claim 16, wherein said sensor further comprises a protection layer being oriented in (1,1,1) plane.

18. The sensor as claimed in claim 15, wherein said sensor further comprises a protection layer being oriented in (1,1,1) plane.

19. The sensor as claimed in claim 1, wherein said at least one nonmagnetic layer consists of first and second nonmagnetic layers and said at least one pinned layer consists of first and second pinned layers, and wherein said sensor has a multi-layered structure of an under layer, said first pinned layer, said first nonmagnetic layer, said free layer, said second nonmagnetic layer and said second pinned layer sequentially layered in this order from a substrate side.

20. The sensor as claimed in claim 19, wherein said under layer is oriented in (1,1,1) plane.

21. The sensor as claimed in claim 20, wherein said sensor further comprises a protection layer being oriented in (1,1,1) plane.

22. The sensor as claimed in claim 19, wherein said sensor further comprises a protection layer being oriented in (1,1,1) plane.

23. A thin-film magnetic head provided with a magnetoresistive effect sensor, said sensor comprising:
   at least one pinned layer, a magnetization direction of said at least one pinned layer being fixed;
   at least one nonmagnetic layer;
   a free layer layered with said at least one pinned layer via said at least one nonmagnetic layer, a magnetization direction of said free layer being variable depending upon a magnetic field applied to said free layer; and
   a mutual diffusion layer made of a nonmagnetic metal and provided with a thickness of 0.1 to 0.5 nm, a metallic composition of said free layer being diffused in said mutual diffusion layer,
   a nonmagnetic metal being diffused in at least part of said free layer.

24. A magnetoresistive effect sensor comprising:
   at least one pinned layer, a magnetization direction of said at least one pinned layer being fixed;
   at least one nonmagnetic layer;
   a free layer layered with said at least one pinned layer via said at least one nonmagnetic layer, a magnetization direction of said free layer being variable depending upon a magnetic field applied to said free layer; and
   a mutual diffusion layer made of a nonmagnetic metal and inserted in the middle of said free layer, a metallic composition of said free layer being diffused in said mutual diffusion layer,
   a nonmagnetic metal being diffused in at least part of said free layer.

25. The sensor as claimed in claim 24, wherein said mutual diffusion layer is layered on one face of said free layer, the other face of said free layer being in contact with said at least one nonmagnetic layer.

26. The sensor as claimed in claim 24, wherein said nonmagnetic metal contains at least one component selected from a group of Al, Si, Ti, V, Cr, Mn, Ga, Ge, Y, Zr, Nb, Mo, Ru, Rh, Pd, In, Sn, Hf, Ta, W, Re, Os, Ir and Pt.

27. The sensor as claimed in claim 24, wherein said sensor further comprises at least one anti-ferromagnetic layer for fixing the magnetization direction of said at least one pinned layer using a bias magnetic field due to exchange coupling, said at least one anti-ferromagnetic layer being layered to contact with said at least one pinned layer.

28. The sensor as claimed in claim 27, wherein said at least one pinned layer has a single layer structure including a ferromagnetic layer.

29. The sensor as claimed in claim 27, wherein said at least one pinned layer has a multi-layered structure including ferromagnetic layers.

30. The sensor as claimed in claim 27, wherein said at least one pinned layer has a multi-layered structure including ferromagnetic layers and a nonmagnetic layer.

31. The sensor as claimed in claim 24, wherein said at least one pinned layer has a multi-layered structure including at least two ferromagnetic layers that are anti-ferromagnetically coupled with each other to have magnetic moments in opposite directions.

32. The sensor as claimed in claim 24, wherein said at least one pinned layer is at least one ferromagnetic layer, a magnetization of said at least one ferromagnetic layer being fixed by a magnetic field produced due to a current flowing through said sensor.

33. The sensor as claimed in claim 24 wherein said at least one nonmagnetic layer consists of one nonmagnetic layer and said at least one pinned layer consists of one pinned layer, and wherein said sensor has a multi-layered structure of an under layer, said free layer, said one nonmagnetic layer and said one pinned layer sequentially layered in this order from a substrate side.

34. The sensor as claimed in claim 33, wherein said under layer is oriented in (1,1,1) plane.

35. The sensor as claimed in claim 34, wherein said sensor further comprises a protection layer being oriented in (1,1,1) plane.

36. The sensor as claimed in claim 33, wherein said sensor further comprises a protection layer being oriented in (1,1,1) plane.

37. The sensor as claimed in claim 24, wherein said at least one nonmagnetic layer consists of one nonmagnetic layer and said at least one pinned layer consists of one pinned layer, and wherein said sensor has a multi-layered structure of an under layer, said one pinned layer, said one nonmagnetic layer and said free layer sequentially layered in this order from a substrate side.

38. The sensor as claimed in claim 37, wherein said under layer is oriented in (1,1,1) plane.

39. The sensor as claimed in claim 38, wherein said sensor further comprises a protection layer being oriented in (1,1,1) plane.

40. The sensor as claimed in claim 37, wherein said sensor further comprises a protection layer being oriented in (1,1,1) plane.

41. The sensor as claimed in claim 24, wherein said at least one nonmagnetic layer consists of first and second nonmagnetic layers and said at least one pinned layer consists of first and second pinned layers, and wherein said sensor has a multi-layered structure of an under layer, said first pinned layer, said first nonmagnetic layer, said free layer, said second nonmagnetic layer and said second pinned layer sequentially layered in this order from a substrate side.

42. The sensor as claimed in claim 41, wherein said under layer is oriented in (1,1,1) plane.

43. The sensor as claimed in claim 42, wherein said sensor further comprises a protection layer being oriented in (1,1,1) plane.

44. The sensor as claimed in claim 41, wherein said sensor further comprises a protection layer being oriented in (1,1,1) plane.

45. A thin-film magnetic head provided with a magnetoresistive effect sensor, said sensor comprising:
   at least one pinned layer, a magnetization direction of said at least one pinned layer being fixed;
   at least one nonmagnetic layer;
   a free layer layered with said at least one pinned layer via said at least one nonmagnetic layer, a magnetization direction of said free layer being variable depending upon a magnetic field applied to said free layer; and
   a mutual diffusion layer made of a nonmagnetic metal and inserted in the middle of said free layer, a metallic composition of said free layer being diffused in said mutual diffusion layer,
   a nonmagnetic metal being diffused in at least part of said free layer.

* * * * *